United States Patent [19]
Fujimoto

[11] Patent Number: 5,638,286
[45] Date of Patent: Jun. 10, 1997

[54] LATCH-UP VERIFICATION DEVICE

[75] Inventor: Yutaka Fujimoto, Itami, Japan

[73] Assignee: Mitsubishi Denki Kabushiki Kaisha, Tokyo, Japan

[21] Appl. No.: 52,602

[22] Filed: Apr. 27, 1993

[30] Foreign Application Priority Data

May 7, 1992 [JP] Japan ................................. 4-114711
Apr. 6, 1993 [JP] Japan ................................. 5-079554

[51] Int. Cl.$^6$ ............................................ G06F 17/50
[52] U.S. Cl. ........................... 364/488; 364/489; 364/490; 364/491
[58] Field of Search ..................... 364/488, 489, 364/490, 491; 357/23.4, 45; 437/51, 59

[56] References Cited

U.S. PATENT DOCUMENTS

| | | | |
|---|---|---|---|
| 4,745,084 | 5/1988 | Rowson et al. | 437/51 |
| 4,791,316 | 12/1988 | Winnerl et al. | 307/296 R |
| 4,937,756 | 6/1990 | Hsu et al. | 364/490 |
| 4,952,522 | 8/1990 | Yamada et al. | 437/34 |
| 5,012,427 | 4/1991 | Kuribayashi | 364/490 |
| 5,231,590 | 7/1993 | Kumar et al. | 364/488 |
| 5,347,185 | 9/1994 | Tailliet | 307/540 |
| 5,422,299 | 6/1995 | Neudeck et al. | 437/63 |

OTHER PUBLICATIONS

Menozzi et al., "Latch-Up Testing in CMOS IC's," IEEE J. of Solid State Physics, Aug. 90, pp. 1010–1014.

Momose et al., "Novel Test Structures for the Characterization of Latch Up Tolerance in a Bipolar and Mosfet Device," IEEE, 1991, pp. 225–230.

Takahiro Aoki, "A New Latch Up Test Structure for Practical Design Methodology for Internal Circuits in the Standard Cell–based CMOS/BiCMOS LSIs", Proc. IEEE, Mar. 1992, pp. 18–23.

*Primary Examiner*—Kevin J. Teska
*Assistant Examiner*—Thai Phan
*Attorney, Agent, or Firm*—Oblon, Spivak, McClelland, Maier & Neustadt, P.C.

[57] ABSTRACT

A latch-up verification device including a latch-up verifying portion (3) which automatically performs a latch-up verification upon a layout pattern specified by layout pattern data (D1) by using transistor information (D4) with back gate terminal information given from the layout pattern data (D1) as a function of connection between a source terminal of respective transistors having the same back gate terminal information and a well region including the transistors, whereby the automatic latch-up verification with a constant accuracy is performed upon a layout pattern of CMOS structure with greatly increased efficiency.

20 Claims, 35 Drawing Sheets

5,638,286

LATCH-UP VERIFICATION DEVICE

BACKGROUND OF THE INVENTION

1. Field of the Invention

The present invention relates to a latch-up verification device for layout pattern data of a CMOS semiconductor integrated circuit (IC).

2. Description of the Background Art

FIG. 29 is a cross-sectional view of an inverter serving as a typical gate of a CMOS semiconductor integrated circuit. Referring to FIG. 29, an N⁻ well region 102 is formed in the upper portion of a P⁻ substrate 101. P⁺ diffusion regions 103, 104 and an N⁺ diffusion region 105 are selectively formed in the surface of the N⁻ well region 102. N⁺ diffusion regions 106, 107 and a P⁺ diffusion region 108 are selectively formed in the surface of a part of the P⁻ substrate 101 in which the N⁻ well region 102 is absent. A gate electrode 109 is formed above intermediate the P⁺ diffusion regions 103 and 104 through an oxide film (not shown), and a gate electrode 110 is formed above intermediate the N⁺ diffusion regions 106 and 107 through an oxide film (not shown). The gate electrodes 109 and 110 are connected in common.

With the aforesaid arrangement, there is formed a CMOS inverter including a PMOS transistor consisting of the P⁺ diffusion regions 103, 104 and the gate electrode 109 and an NMOS transistor consisting of the N⁺ diffusion regions 106, 107 and the gate electrode 110. The N⁺ diffusion region 105 is provided for securing the potential at the N⁻ well region 102, and the P⁺ diffusion region 108 is provided for securing the potential at the P⁻ substrate 101.

FIG. 30 is a circuit diagram of a latch-up structure parasitic on a CMOS inverter having the structure of FIG. 29. Referring to FIG. 30, the CMOS inverter as shown in FIG. 29 is provided with a parasitic thyristor formed by a parasitic PNP bipolar transistor T1 consisting of the P⁺ diffusion region 104, the N⁻ well region 102 and the P⁻ substrate 101 and a parasitic NPN bipolar transistor T2 consisting of the N⁺ diffusion region 106, the P⁻ substrate 101 and the N⁻ well region 102. Reference character R1 designates a wire resistance between a power supply $V_{DD}$ and the P⁺ diffusion region 104; R2 designates a wire resistance between the power supply $V_{DD}$ and the N⁺ diffusion region 105 or N⁻ well region 102; R3 designates a wire resistance between the ground level and the P⁺ diffusion region 108 or substrate 101; and R4 designates a wire resistance between the ground level and the N⁺ diffusion region 106.

In such an arrangement, when a base current flows in the forward direction to either the PNP bipolar transistor T1 or the NPN bipolar transistor T2, a latch-up phenomenon occurs such that both of the PNP and NPN bipolar transistors turn on and enter the positive feedback state to maintain the on-state until the power supply is cut off.

FIG. 31 is a plan view of an exemplary layout pattern in which the latch-up phenomenon occurs. Referring to FIG. 31, reference numeral 111 designates an N⁻ well region; 112 to 116 designate P⁺ diffusion regions; 117 designates an N⁺ diffusion region; 119, 120, 122 and 123 designate polysilicon regions; 118, 121 and 135 designate metal wiring regions; 125 designates an N⁻ well region; 126 and 127 designate P⁺ diffusion regions; 128 designates an N⁺ diffusion region; 130 designates a polysilicon region; 124, 129, 131 and 139 designates metal wiring regions; 132 to 134 and 147 designate N⁺ diffusion regions; 136 and 137 designate N⁺ diffusion regions; and 138 and 146 designate P⁺ diffusion regions. The crosses of FIG. 31 indicate contact regions. A first power supply voltage $V_{DD}1$ from the power supply $V_{DD}$ is applied to the metal wiring region 131 through a $V_{DD}$ wire (not shown), and a second power supply voltage $V_{DD}2$ from the power supply $V_{DD}$ is applied to the metal wiring region 118 through a $V_{DD}$ wire (not shown). Input signals S1, S2 and S3 are applied to the polysilicon regions 119, 123 and 130, respectively. The layout pattern is formed on a P substrate (not shown).

FIG. 32 is a circuit diagram showing the electrical connection of the CMOS integrated circuit formed by the layout pattern of FIG. 31. Referring to FIG. 32, a PMOS transistor Q1 includes the P⁺ diffusion regions 112, 113 and the polysilicon region 119, and a PMOS transistor Q2 includes the P⁺ diffusion regions 113, 114 and the polysilicon region 120.

An NMOS transistor Q3 includes the N⁺ diffusion regions 134, 133 and the polysilicon region 119, and an NMOS transistor Q4 includes the N⁺ diffusion regions 147, 132 and the polysilicon region 120. A PMOS transistor Q5 includes the P⁺ diffusion regions 115, 116 and the polysilicon region 123, and a PMOS transistor Q6 includes the P⁺ diffusion regions 126, 127 and the polysilicon region 130. An NMOS transistor Q7 includes the N⁺ diffusion regions 136, 137 and the polysilicon region 130.

FIG. 33 is a circuit diagram of a parasitic thyristor structure where attention is focused on the P⁺ diffusion region 116 of FIG. 31. The P⁺ diffusion region 116, the N⁻ well region 111 and the P⁻ substrate form the parasitic PNP bipolar transistor T1. When the PMOS transistor Q6 is on, a potential difference between the power supply voltages $V_{DD}1$ and $V_{DD}2$, if generated, causes a base current to flow in the forward direction to the PNP bipolar transistor T1, resulting in occurrence of latch-up.

FIG. 34 is a plan view of a chip of the CMOSIC. Referring to FIG. 34, cells 141, 142, a $V_{DD}$ pad 140 and a GND pad 143 are formed on a semiconductor chip 145. Thus the resistance of the wiring path between the $V_{DD}$ pad 140 and the power supply voltage $V_{DD}1$ at the cell 141 is indicated by R5, and the resistance of the wiring path between the $V_{DD}$ pad 140 and the power supply voltage $V_{DD}2$ at the cell 142 is indicated by (R5+R6). Likewise, the resistance of the GND wiring path between the GND pad 143 and the ground voltage GND2 at the cell 142 is indicated by R8, and the resistance of the GND wiring path between the GND pad 143 and the ground voltage GND1 at the cell 141 is indicated by (R7+R8).

In general, the conventional CMOSIC has been structured such that a potential difference is generated easily between $V_{DD}2$ and $V_{DD}1$ which should be at the same level due to a difference in resistance based on different $V_{DD}$ and GND wiring paths, the manner of supply of the power supply voltages to cells, and operating modes and operating timings in the cells.

It will be appreciated from the above description that the layout pattern of the conventional CMOS structure might highly possibly be arranged to generate latch-up easily.

There are many typical layout patterns which easily cause latch-up. The combination of the layout patterns cause latch-up more easily. Therefore it is highly possible to design a layout pattern whose structure causes latch-up easily in designing a CMOS integrated circuit.

It is therefore necessary to verify whether the layout pattern after being designed is liable to cause latch-up. In the conventional verifying method, a person has generally performed a visual verification while being conscious of the regularity of the structure in which latch-up is liable to occur. Such verification, if performed on a large layout pattern, requires much time so that the visual accuracy decreases. As a result, he may overlook the layout pattern in which latch-up is liable to occur. The definition of the layout patterns which easily cause latch-up is somewhat like know-how and is difficult to be grasped quantitatively. In addition, too many items are forbidden when the layout is made. This presents a problem that designers have widely varying verification abilities depending on their experiences.

SUMMARY OF THE INVENTION

According to the present invention, a latch-up verification device comprises: layout pattern data providing means for providing layout pattern data specifying a layout pattern of a CMOS semiconductor integrated circuit including a semiconductor substrate of a first conductivity type and at least one well region of a second conductivity type formed on the semiconductor substrate; in-well MOS transistor extracting means for extracting at least one MOS transistor formed in the well region as an in-well MOS transistor as a function of the layout pattern data; and latch-up verifying means for verifying the danger of latch-up occurrence in the layout pattern specified by the layout pattern data as a function of connection between a first electrode of the in-well MOS transistor and the well region in which the in-well MOS transistor is formed.

The latch-up verifying means of the latch-up verification device uses as verifying data the connection between the first electrode of the in-well MOS transistor and the well region in which the extracted in-well MOS transistor is formed.

Such verifying data affords the detection of the in-well MOS transistor which might receive a power supply from a region other than the well region in which it is formed.

According to the latch-up verification device, the latch-up verifying means verifies the presence of the in-well MOS transistor which might receive the power supply from a region other than the well region in which it is formed as a function of the connection between the first electrode of the in-well MOS transistor and the well region in which the in-well MOS transistor is formed, to thereby achieve the latch-up verification upon the layout pattern of CMOS structure with greatly increased efficiency and with constant verification accuracy.

In another aspect of the present invention, a latch-up verification device comprises: layout pattern data providing means for providing layout pattern data specifying a layout pattern of a CMOS semiconductor integrated circuit including a semiconductor substrate of a first conductivity type and at least one well region of a second conductivity type formed on the semiconductor substrate; semiconductor region extracting means receiving the layout pattern data for extracting from the layout pattern data a first semiconductor region of the first conductivity type and a second semiconductor region of the second conductivity type each formed in a surface of the semiconductor substrate or the common well region and connected directly to a common power supply; and latch-up verifying means for verifying the danger of latch-up occurrence in the layout pattern specified by the layout pattern data as a function of a distance between the first and second semiconductor regions.

The latch-up verifying means of the latch-up verification device uses as verifying data the distance between the first semiconductor region of the first conductivity type and the second semiconductor region of the second conductivity type each of which is formed in a surface of the semiconductor substrate or the common well region and is connected directly to the common power supply.

Such verifying data affords the verification whether the PN junction of a parasitic bipolar transistor consisting of one of the first and second semiconductor regions of the first and second conductivity type, the well region of the second conductivity type, and the semiconductor substrate of the first conductivity type is easily biased in the forward direction.

According to the latch-up verification device, the latch-up verifying means verifies, as a function of the distance between the first semiconductor region of the first conductivity type and the second semiconductor region of the second conductivity type each of which is formed in a surface of the semiconductor substrate or the common well region and is connected directly to the common power supply, whether or not the PN junction of the parasitic bipolar transistor consisting of one of the first and second semiconductor regions of the first and second conductivity type, the well region of the second conductivity type, and the semiconductor substrate of the first conductivity type is biased easily in the forward direction, to thereby achieve the latch-up verification upon the layout pattern of CMOS structure with greatly increased efficiency and with constant verification accuracy.

In still another aspect of the present invention, a latch-up verification device comprises: layout pattern data providing means for providing layout pattern data specifying a layout pattern of a CMOS semiconductor integrated circuit including a semiconductor substrate of a first conductivity type and at least one well region of a second conductivity type formed on the semiconductor substrate; semiconductor region extracting means receiving the layout pattern data for extracting from the layout pattern data a semiconductor region of the second conductivity type formed in a surface of the semiconductor substrate and connected directly to a predetermined power supply; and latch-up verifying means for verifying the danger of latch-up occurrence in the layout pattern specified by the layout pattern data as a function of a distance between the semiconductor region and the well region.

The latch-up verifying means of the latch-up verification device uses as verifying data the distance between the well region and the semiconductor region of the second conductivity type which is formed in a surface of the semiconductor substrate and is connected directly to the predetermined power supply.

Such verifying data affords the verification whether the parasitic bipolar transistor easily becomes active which consists of the semiconductor region of the second conductivity type, the semiconductor substrate of the first conductivity type, and the well region of the second conductivity type.

According to the latch-up verification device, the latch-up verifying means verifies, as a function of the distance between the well region and the semiconductor region of the second conductivity type which is formed in a surface of the semiconductor substrate and is connected directly to the predetermined power supply, whether or not the parasitic bipolar transistor consisting of the semiconductor region of the second conductivity type, the semiconductor substrate of the first conductivity type, and the well region of the second conductivity type easily becomes active, to thereby achieve the latch-up verification upon the layout pattern of CMOS structure with greatly increased efficiency and with constant verification accuracy.

An object of the present invention is to provide a latch-up verification device which greatly increases the efficiency of a latch-up verification on a layout pattern of a CMOS structure and which is capable of performing the verification with uniform accuracies independently of designing experiences.

These and other objects, features, aspects and advantages of the present invention will become more apparent from the following detailed description of the present invention when taken in conjunction with the accompanying drawings.

DESCRIPTION OF THE PREFERRED EMBODIMENTS

Latch-up verification devices of first to seventh preferred embodiments to be described hereinafter are devices for performing a latch-up verification upon a layout pattern of a CMOS integrated circuit including a semiconductor region of a first conductivity type and at least one well region of a second conductivity type formed on the semiconductor region.

First Preferred Embodiment

Figure 1:
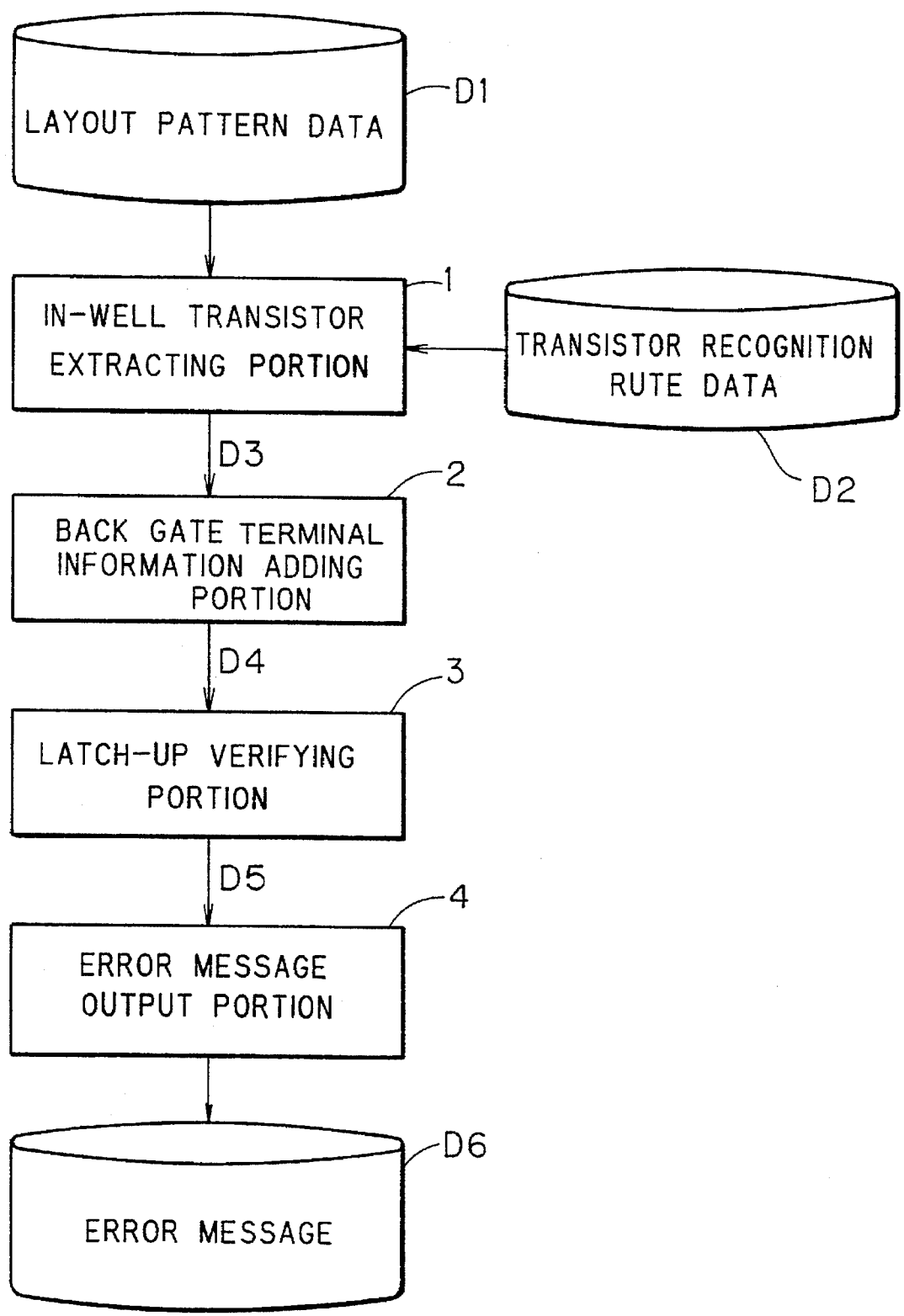
FIG. 1 is a block diagram of a latch-up verification device according to a first preferred embodiment of the present invention.

FIG. 1 is a block diagram of a latch-up verification device according to a first preferred embodiment of the present invention. Referring to FIG. 1, an in-well transistor extracting portion 1 receives layout pattern data D1 from a layout pattern data providing portion (not shown) and receives transistor recognition rule data D2 from a transistor recognition rule data providing means (not shown). The in-well transistor extracting portion 1 extracts from the layout pattern data D1 all transistors formed in well regions in units of one well region by using the transistor recognition rule data D2 to output in-well transistor information D3 to a back gate terminal information adding portion 2.

The back gate terminal information adding portion 2 groups together all of the transistors included in the same well region as the transistors having the same back gate terminal from the in-well transistor information D3 and adds the same back gate terminal information to the transistors in units of one well region to output transistor information D4 with back gate terminal information to a latch-up verifying portion 3.

The latch-up verifying portion 3 performs the following verification from the transistor information D4 with back gate terminal information:

Three conditions are established:

(1) A source terminal of the respective transistors having the same back gate terminal information is connected directly to the well region including the transistors.

(2) The former is connected to the latter through a resistance.

(3) The former is connected to the latter in series in a drain-source terminal direction through a single or a plurality of transistors included in the same well region.

The latch-up verifying portion 3 extracts an MOS transistor which does not meet any of the conditions as a latch-up MOS transistor to output latch-up verification result information D5 containing the extracted latch-up MOS transistor to an error message output portion 4.

Figure 31:
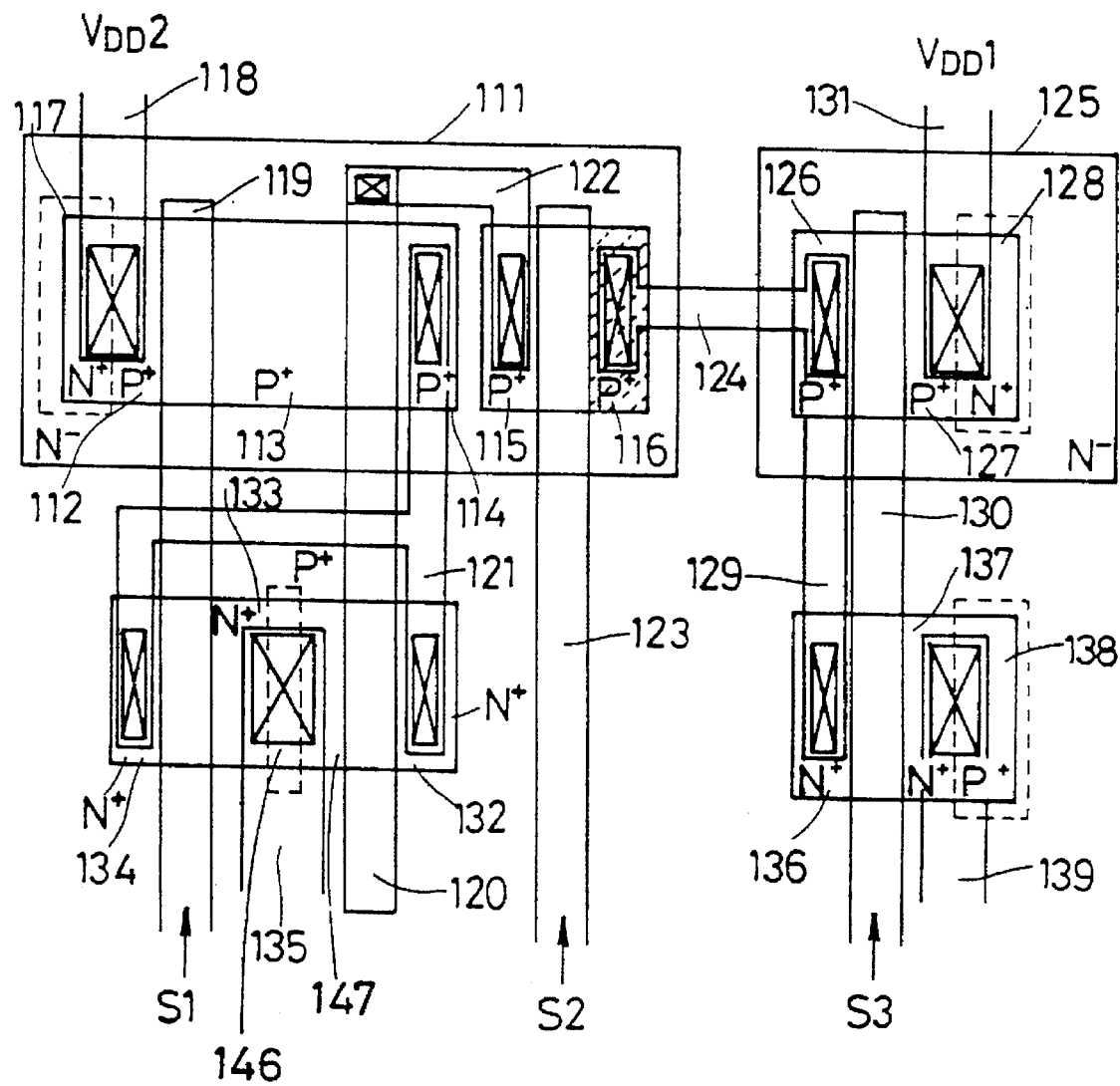
FIG. 31 is a plan view of a layout pattern for delineating the latch-up phenomenon.
Figure 32:
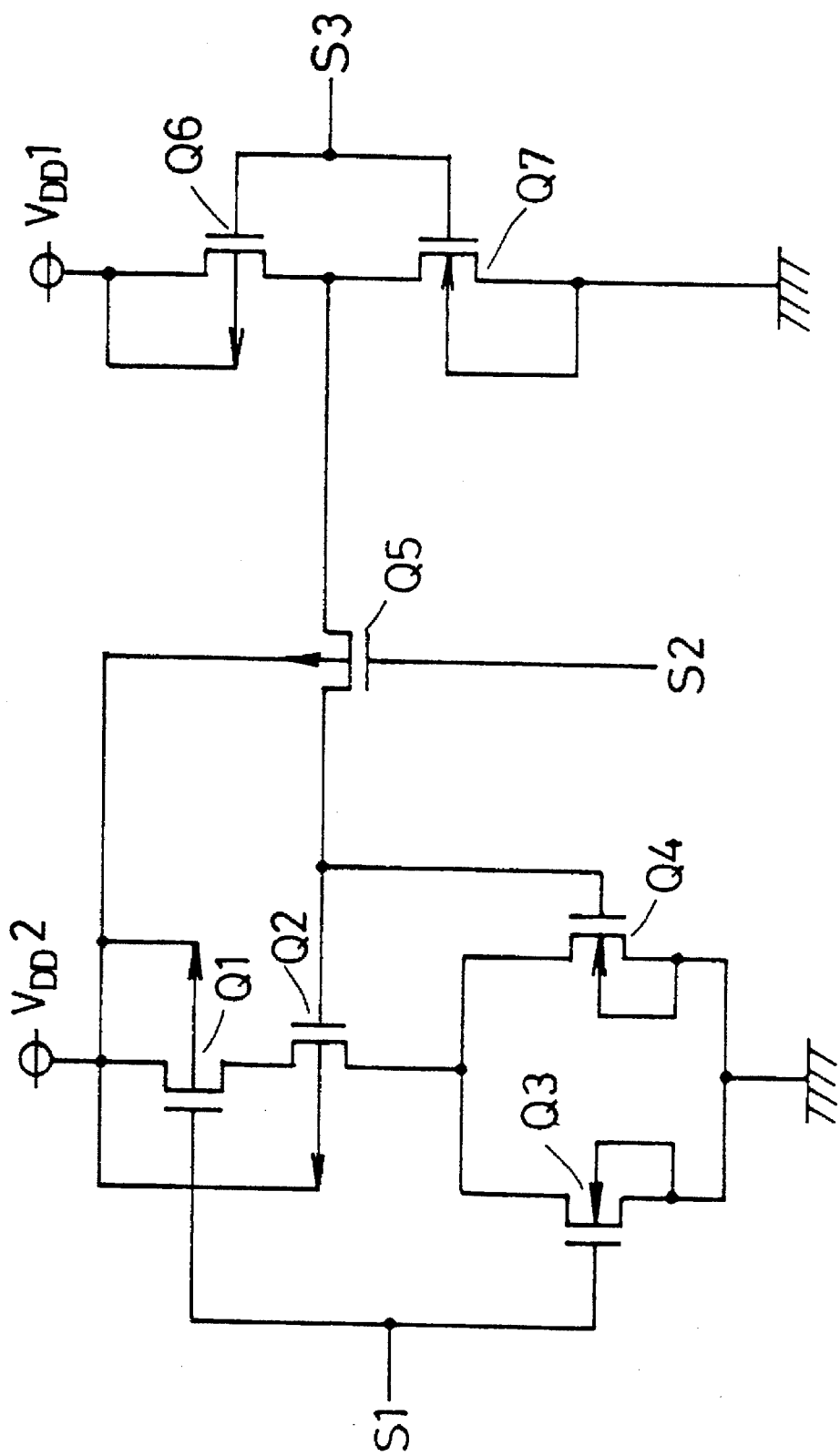
FIGS. 32 and 33 are circuit diagrams for delineating the latch-up phenomenon.
Figure 33:
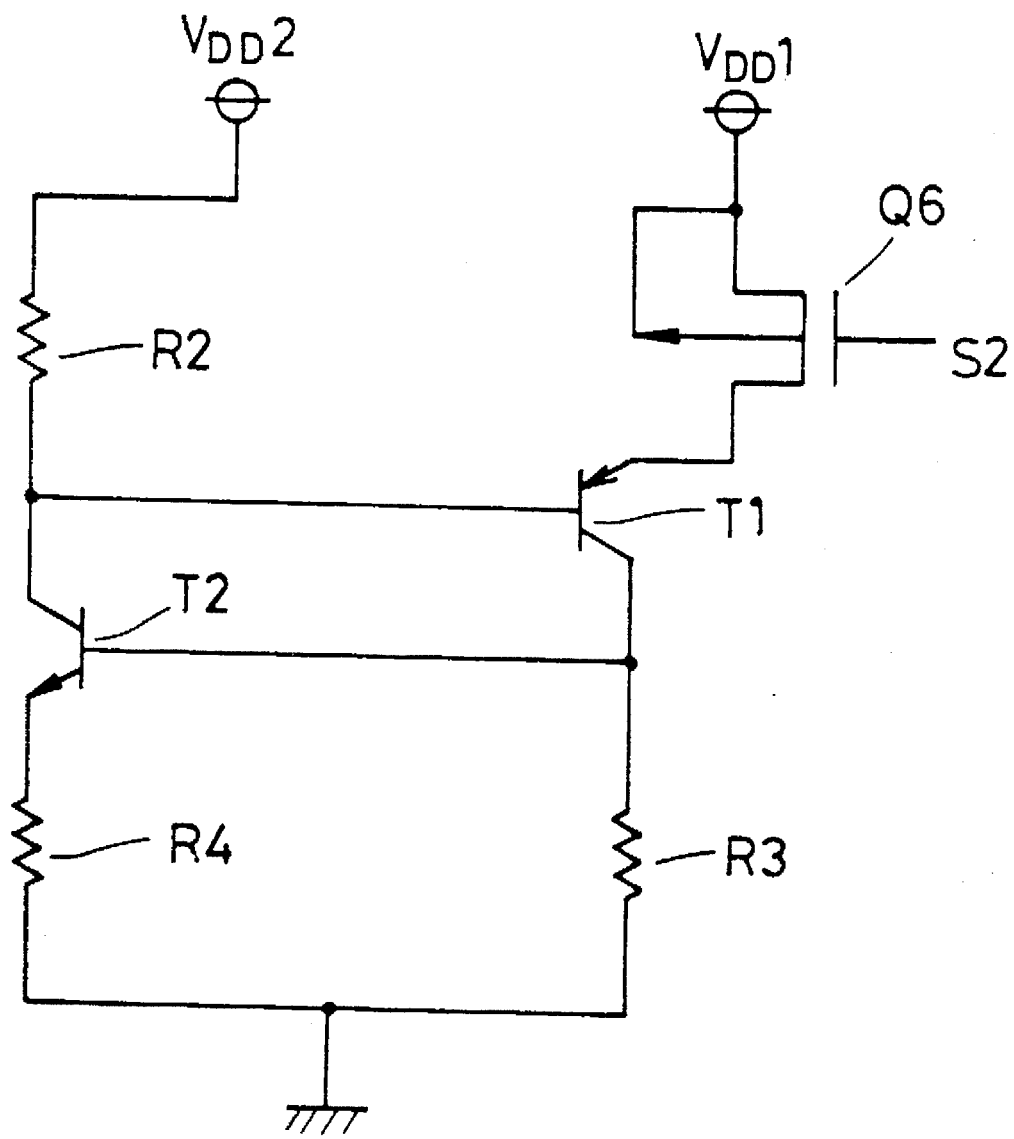
Figure 34:
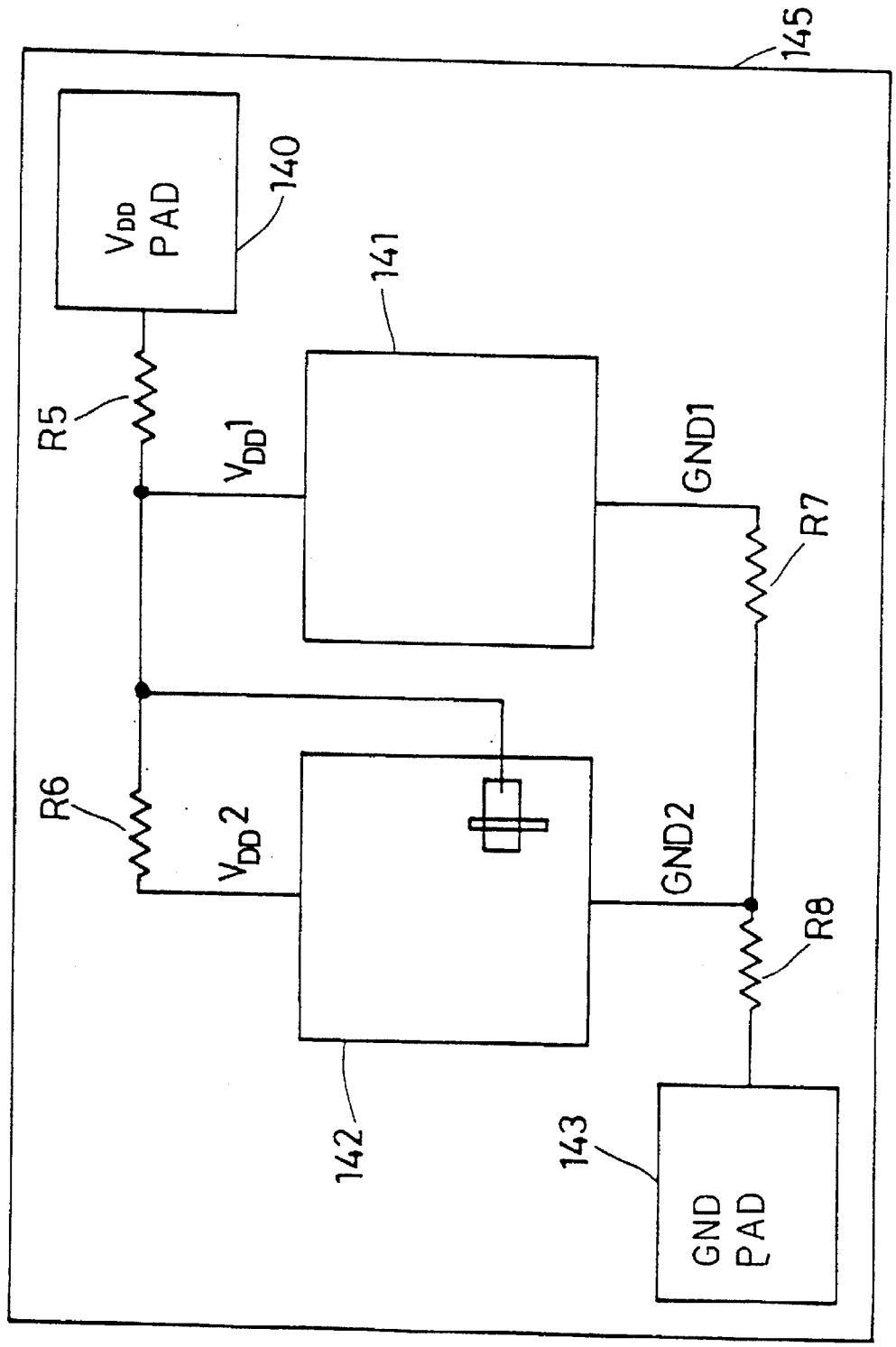
FIG. 34 is an illustration for delineating the latch-up phenomenon.

As for example, when the layout pattern of FIG. 31 is designed, the PMOS transistors Q1, Q2 and Q5 which share the N⁻ well region 111 are taken as the MOS transistors having the same back gate terminal.

The latch-up verification is performed on the respective PMOS transistors Q1, Q2, and Q5. The PMOS transistor Q1 satisfies the condition (1), and the PMOS transistor Q2 satisfies the condition (3).

The PMOS transistor Q5, however, does not satisfy any of the conditions (1) to (3), so that the PMOS transistor Q5 is recognized as the latch-up MOS transistor.

The PMOS transistor Q5 which does not satisfy any of the conditions (1) to (3), as a result, satisfies the condition (3) in relation to the different N⁻ well region 125 although it is formed in the N⁻ well region 111.

Specifically, the PMOS transistor Q5 whose back gate potential is the power supply voltage applied to the N⁻ well region 111 might receive the power supply voltage applied to the N⁻ well region 125. The presence of such a MOS transistor having a plurality of power supply voltage sources, which results in a high possibility that the parasitic bipolar transistor including the electrode regions of the MOS transistor is biased in the forward direction at its PN junction, is a significant factor that causes latch-up. For this reason, the MOS transistor having a plurality of power supply voltage sources is recognized as the latch-up MOS transistor.

The error message output portion 4 outputs an error message in list form to a CRT (not shown) or the like on the basis of the latch-up verification result information D5.

Figure 2:
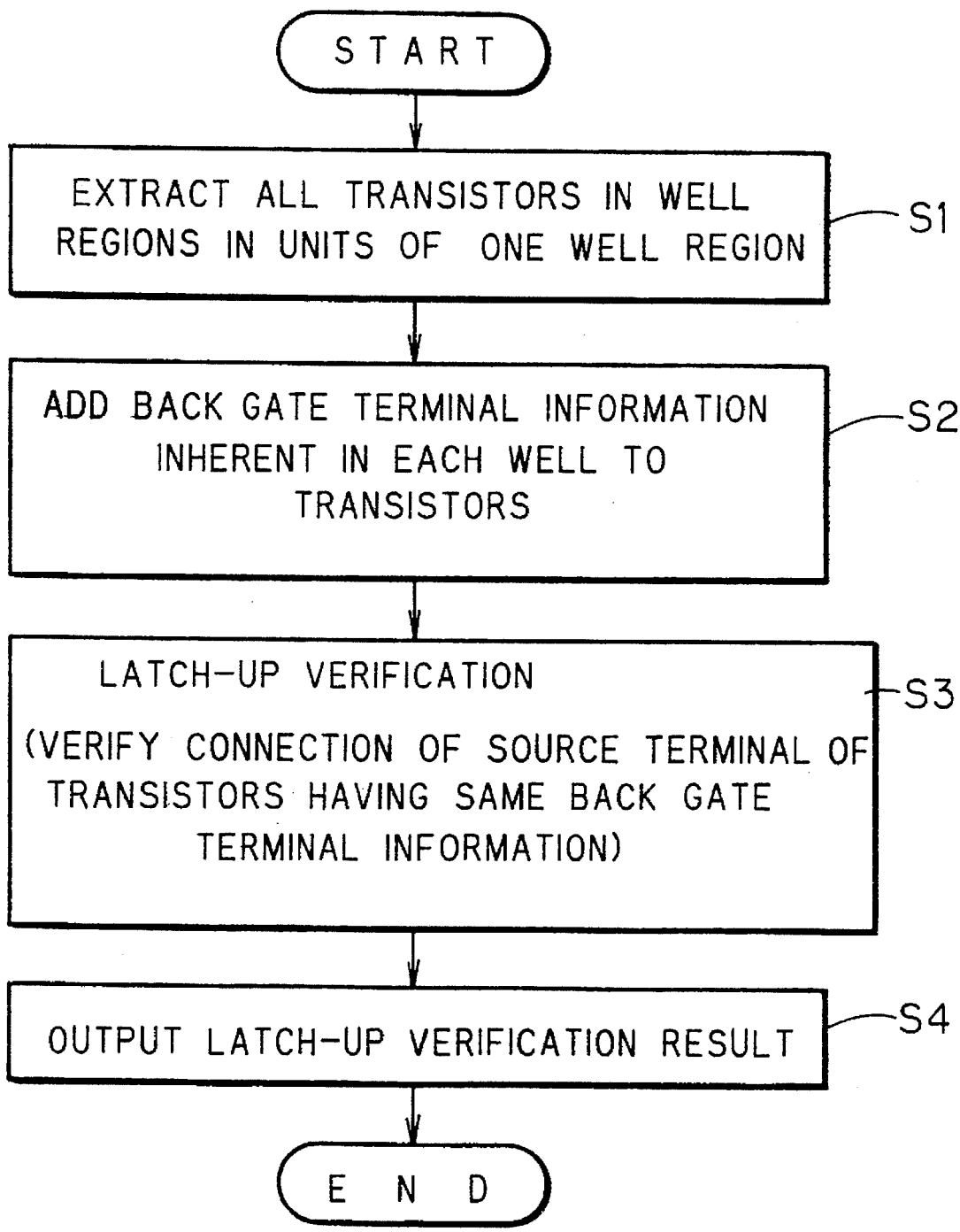
FIG. 2 is a flow chart showing the operation of the latch-up verification device of the first preferred embodiment.

FIG. 2 is a flow chart showing the operation of the latch-up verification device of the first preferred embodiment.

With reference to FIG. 2, the in-well transistor extracting portion 1 extracts all MOS transistors in the well regions in units of one well region from the layout pattern data D1 by using the transistor recognition rule data D2 to output the in-well transistor information D3 to the back gate terminal information adding portion 2, in the step S1.

In the step S2, all of the transistors in the same well region are defined as the transistors having the same back gate terminal and are grouped together in units of one well region. The back gate terminal information inherent in each well region is added to the transistors, and then the transistor information D4 with back gate terminal information is outputted to the latch-up verifying portion 3.

In the step S3, the latch-up verifying portion 3 performs the aforesaid latch-up verification (the verification of the connection of the source terminal of the respective transistors having the same back gate terminal information) from the transistor information D4 with back gate terminal information to output the latch-up verification result information D5 to the error message output portion 4.

In the step S4, the error message output portion 4 outputs the error message in list form to the CRT (not shown) or the like on the basis of the latch-up verification result information D5.

The latch-up verification device of the first preferred embodiment, as described hereinabove, verifies the connection of the source terminal of the MOS transistors in the same well region to thereby automatically verify the layout pattern in which there is the highly possible danger of the latch-up occurrence.

Second Preferred Embodiment

Figure 3:
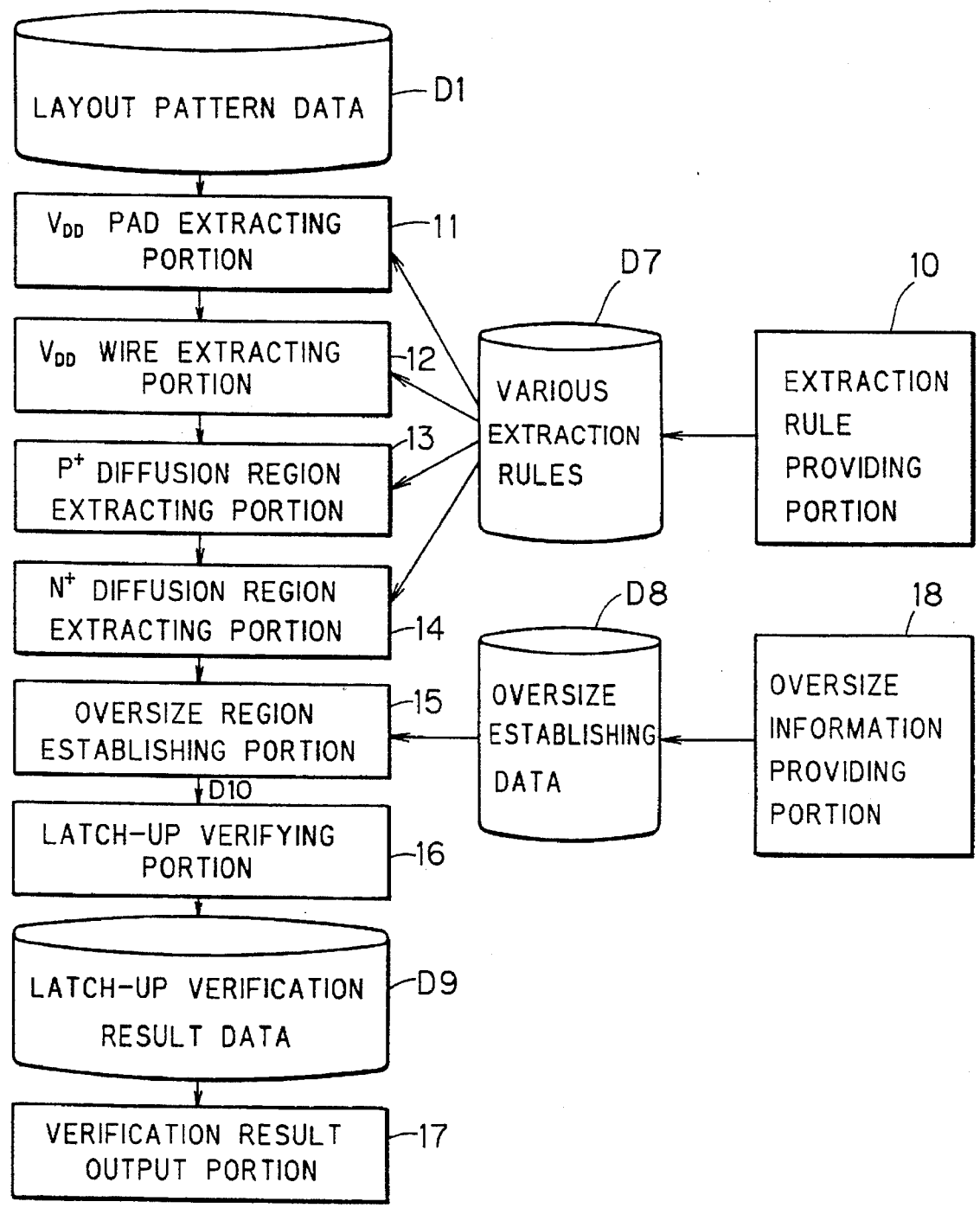
FIG. 3 is a block diagram of the latch-up verification device according to a second preferred embodiment of the present invention.

FIG. 3 is a block diagram of the latch-up verification device according to a second preferred embodiment of the present invention.

Referring to FIG. 3, various extraction rules D7 including $V_{DD}$ pad information, $V_{DD}$ wire information, P⁺ diffusion region information and N⁺ diffusion region information are outputted from an extraction rule providing portion 10 to a $V_{DD}$ pad extracting portion 11, a $V_{DD}$ wire extracting portion 12, a P⁺ diffusion region extracting portion 13 and an N⁺ diffusion region extracting portion 14.

The $V_{DD}$ pad extracting portion 11 receives the layout pattern data D1 from the layout pattern data providing means (not shown) and extracts a $V_{DD}$ pad from the layout pattern data D1 by using the $V_{DD}$ pad information of the various extraction rules D7 to output the $V_{DD}$ pad extracted layout pattern data D1 to the $V_{DD}$ wire extracting portion 12.

The $V_{DD}$ wire extracting portion 12 extracts a $V_{DD}$ wire extending from the $V_{DD}$ pad from the $V_{DD}$ pad extracted layout pattern data D1 by using the $V_{DD}$ wire information of the various extraction rules D7 to output the $V_{DD}$ wire extracted layout pattern data D1 to the P⁺ diffusion region extracting portion 13.

The P⁺ diffusion region extracting portion 13 extracts a P⁺ diffusion region which is formed in the upper portion of the N⁻ well region (or N⁻ substrate) and is connected directly to the $V_{DD}$ wire from the $V_{DD}$ wire extracted layout pattern data D1 by using the P⁺ diffusion region information of the various extraction rules D7, to output the $V_{DD}$ wire direct connected P⁺ diffusion region extracted layout pattern data D1 to the N⁺ diffusion region extracting portion 14.

The N⁺ diffusion region extracting portion 14 extracts an N⁺ diffusion region which is formed in the upper portion of the N⁻ well region (or N⁻ substrate) and is connected directly to the $V_{DD}$ wire from the $V_{DD}$ wire direct connected P⁺ diffusion region extracted layout pattern data D1 by using the N⁺ diffusion region information of the various extraction rules D7, to output the $V_{DD}$ wire direct connected P⁺ and N⁺ diffusion region extracted layout pattern data D1 to an oversize region establishing portion 15.

An oversize information providing portion 18 outputs oversize establishing data D8 serving as verifying data to the oversize region establishing portion 15. It should be noted that the oversize establishing data D8 is determined as a function of the impurity concentrations of the semiconductor substrate and the well region.

The oversize region establishing portion 15 establishes a square oversize region of a size specified by the oversize establishing data D8 about the $V_{DD}$ wire direct connected P⁺ diffusion region from the $V_{DD}$ wire direct connected P⁺ and N⁺ diffusion region extracted layout pattern data D1 by using the oversize establishing data D8, to output oversize region established layout pattern data D10 to a latch-up verifying portion 16.

The latch-up verifying portion 16 verifies the presence of the $V_{DD}$ wire direct connected N⁺ diffusion region in the oversize region from the oversize region established layout pattern data D10. If present, the latch-up verifying portion 16 determines that there is no danger of latch-up. If absent, the latch-up verifying portion 16 determines that the distance between the $V_{DD}$ wire direct connected N⁺ and P⁺ diffusion regions has the danger of the latch-up occurrence. Then the latch-up verifying portion 16 outputs to a verification result output portion 17 latch-up verification result data D9 containing a pair of $V_{DD}$ wire direct connected N⁺ and P⁺ diffusion regions which have been determined to have the danger of the latch-up occurrence.

Figure 29:
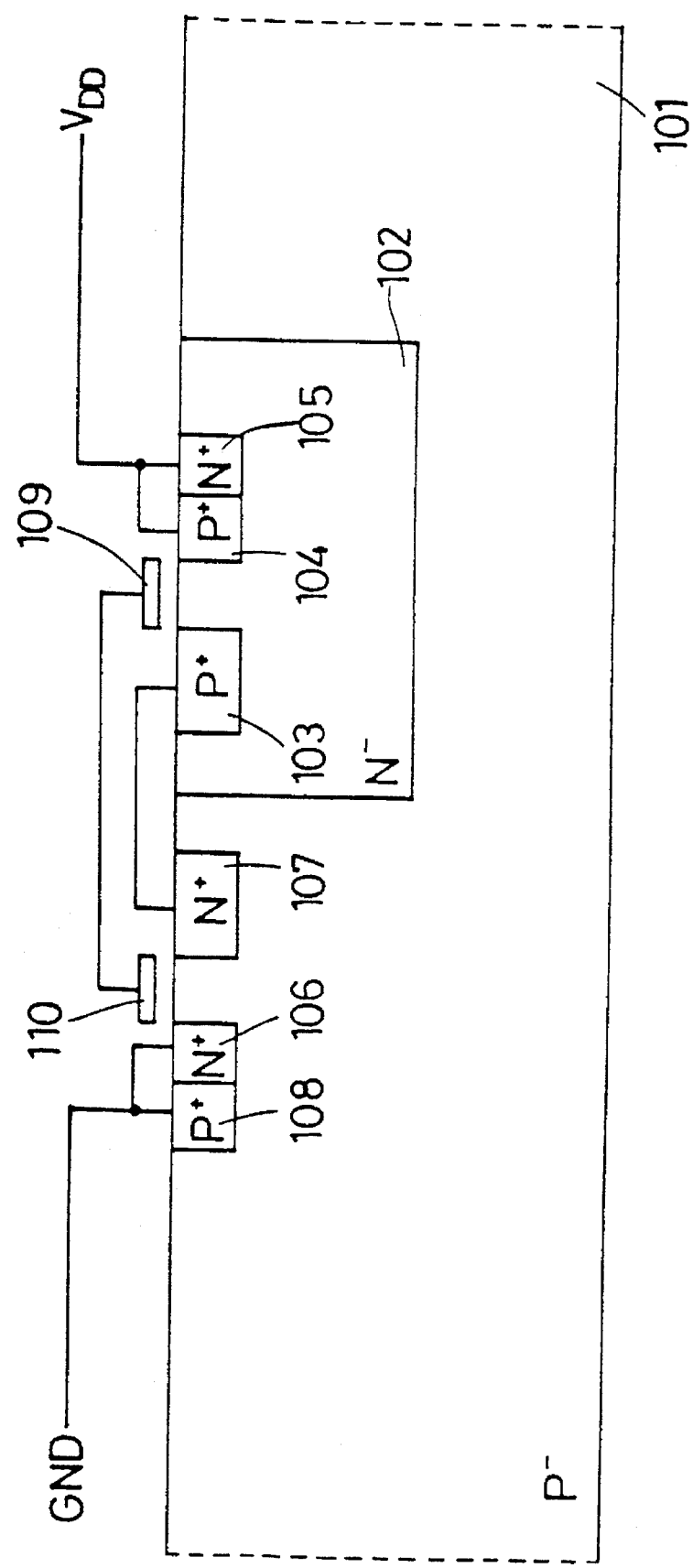
FIG. 29 is a cross-sectional view of an example of CMOS structures.
Figure 30:
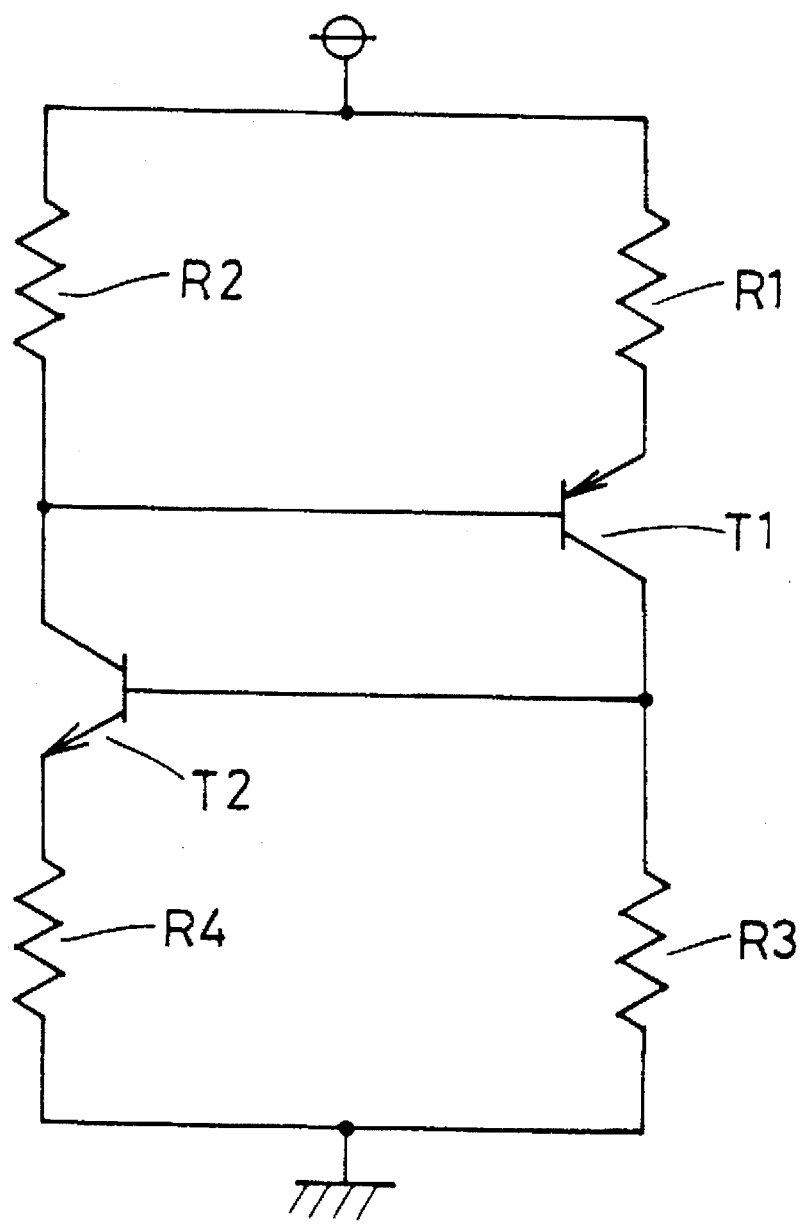
FIG. 30 is a circuit diagram for delineating a latch-up phenomenon.

The details of the latch-up verification will be described hereinafter using the CMOS structure of FIG. 29 as an example. The P⁺ diffusion region 104 and the N⁺ diffusion region 105, which are directly connected to the power supply $V_{DD}$ but which are adjacent to each other, are not a problem. If the $N^+$ diffusion region 105 is spaced from the $P^+$ diffusion region 104 a distance that is too long for the $N^+$ diffusion region 105 to lie within the oversize region about the $P^+$ diffusion region 104, a potential difference is prone to be generated between the $P^+$ diffusion region 104 and the $N^+$ diffusion region 105. In this case, the parasitic PNP bipolar transistor consisting of the $P^+$ diffusion region 104, the $N^-$ well region 102 and the $P^-$ substrate 101 might probably be biased in the forward direction at its PN junction and, as a result there is the highly possible danger of the latch-up occurrence. That is, the parasitic PNP bipolar transistor T1 in the circuit of FIG. 30 is prone to turn on.

The verification result output portion 17 outputs verification result information (not shown) in the form of a list or graphical output on the basis of the latch-up verification result data D9.

Figure 4:
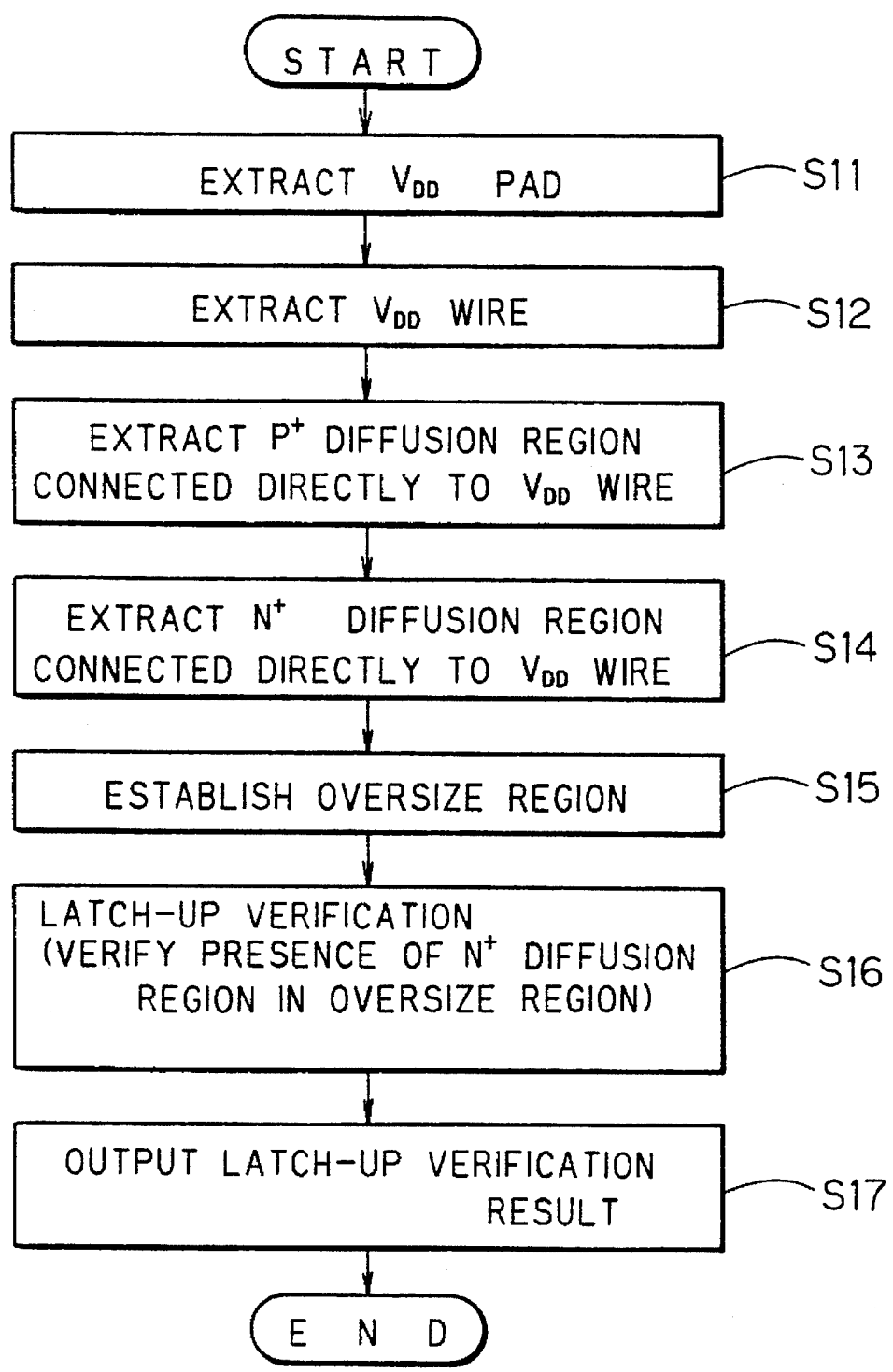
FIG. 4 is a flow chart showing the operation of the latch-up verification device of the second preferred embodiment.
Figure 5:
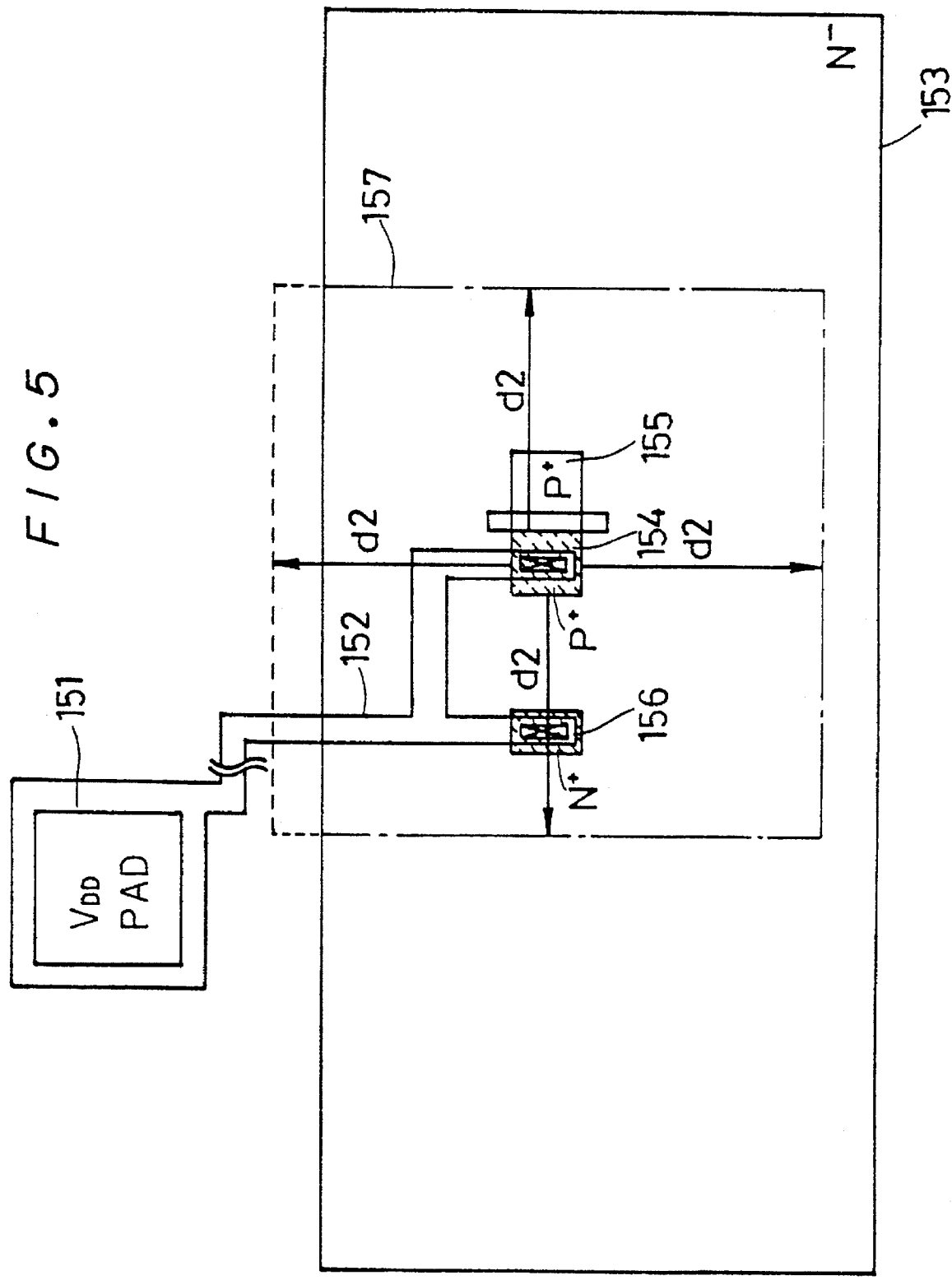
FIGS. 5 to 7 are plan views of layout patterns for delineating the operation of the latch-up verification device of the second preferred embodiment.
Figure 6:
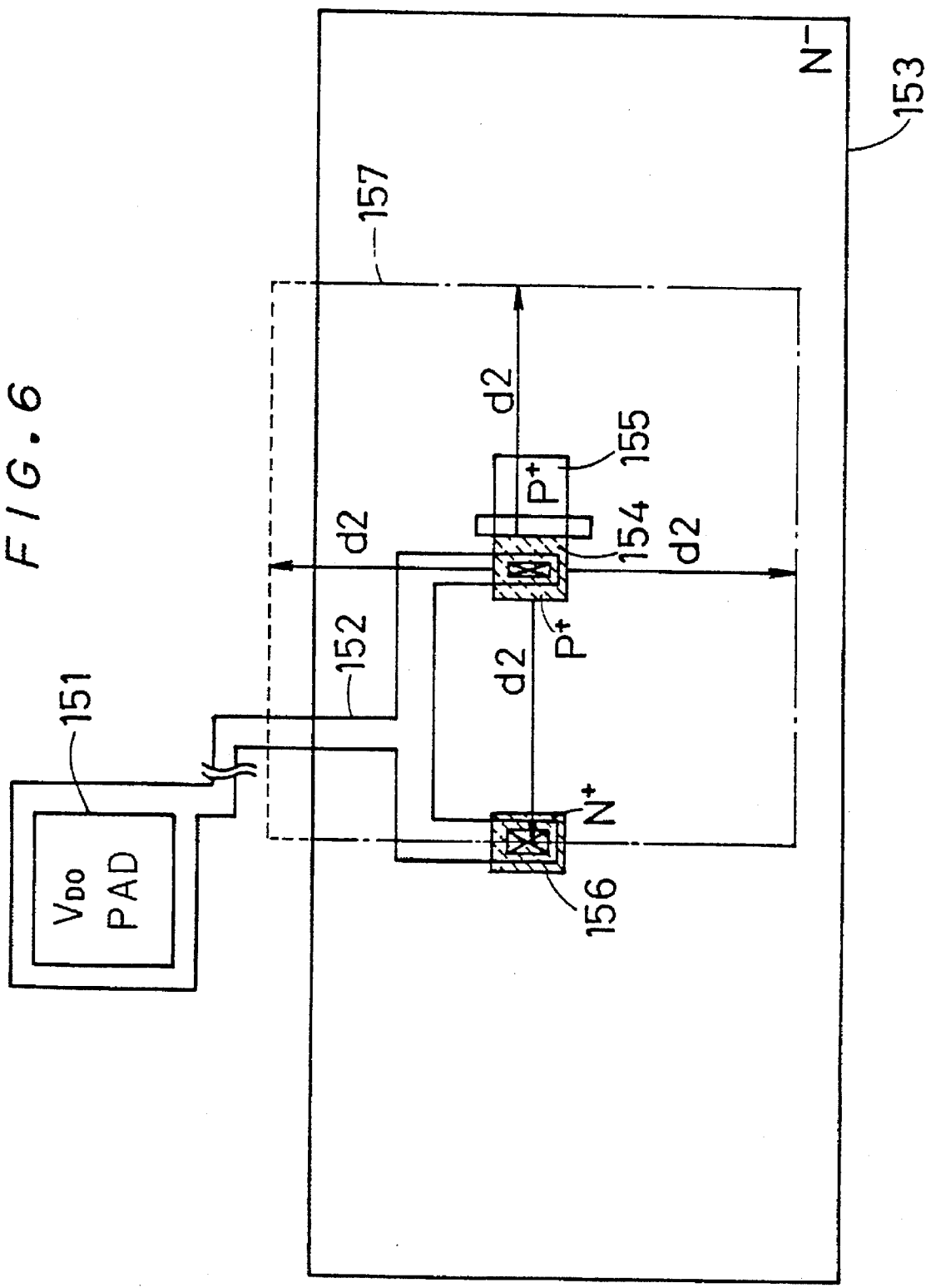
Figure 7:
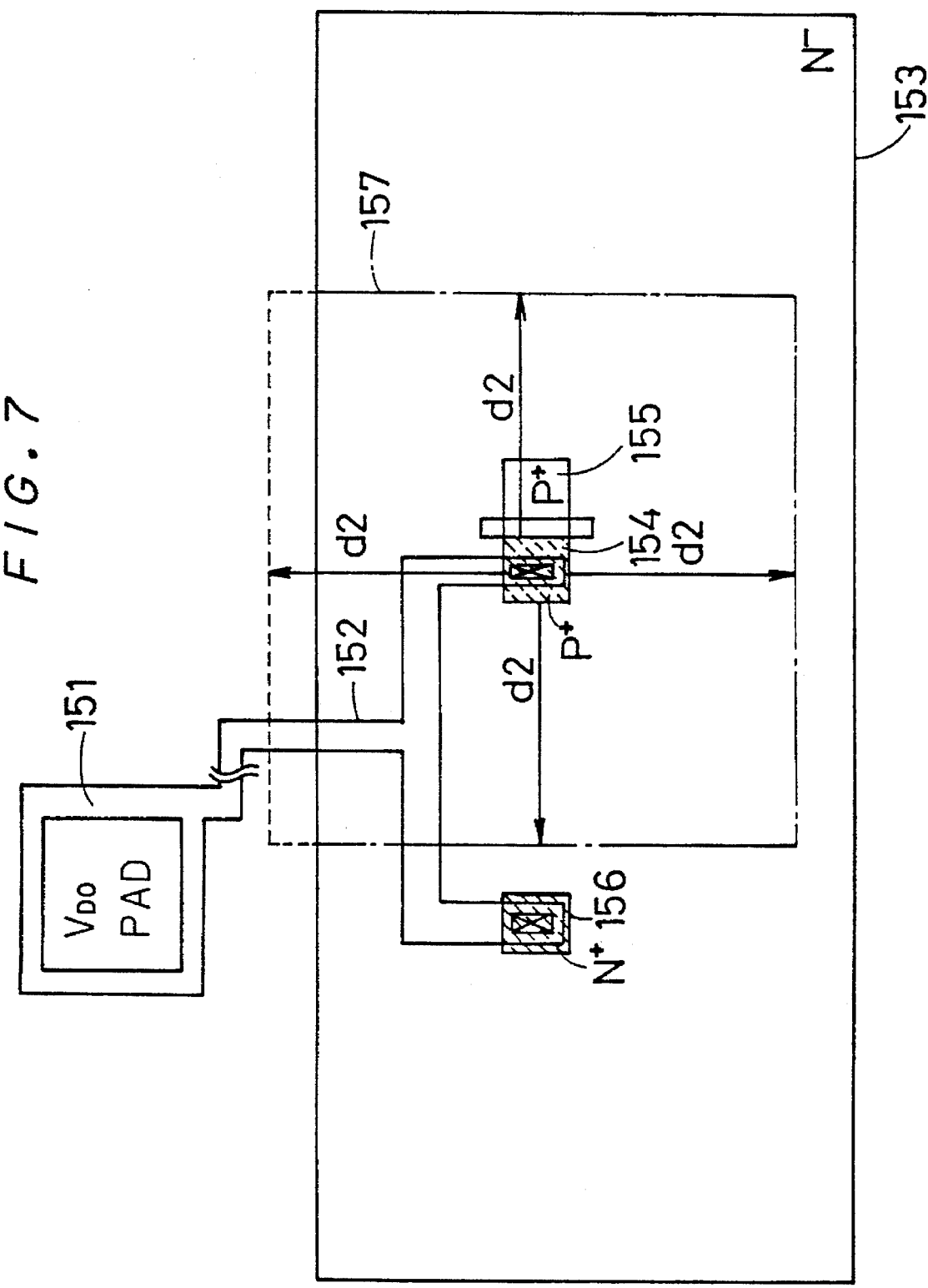

FIG. 4 is a flow chart of the operation of the latch-up verification device of the second preferred embodiment. FIGS. 5 to 7 are plan views for delineating the operation of the latch-up verification device. Referring to FIGS. 4 to 7, the verification operation will be discussed hereinafter.

In the step S11, the $V_{DD}$ pad extracting portion 11 extracts a $V_{DD}$ pad 151 from the layout pattern data D1 by using the $V_{DD}$ pad information of the various extraction rules D7 to output the $V_{DD}$ pad extracted layout pattern data D1 to the $V_{DD}$ wire extracting portion 12.

In the step S12, the $V_{DD}$ wire extracting portion 12 extracts a $V_{DD}$ wire 152 extending from the $V_{DD}$ pad 151 from the $V_{DD}$ pad extracted layout pattern data D1 by using the $V_{DD}$ wire information of the various extraction rules D7 to output the $V_{DD}$ wire extracted layout pattern data D1 to the $P^+$ diffusion region extracting portion 13.

In the step S13, the $P^+$ diffusion region extracting portion 13 extracts a $P^+$ diffusion region 154 connected directly to the $V_{DD}$ wire 152 among $P^+$ diffusion regions 154 and 155 formed in the upper portion of an $N^-$ well region 153 (or $N^-$ substrate) from the $V_{DD}$ wire extracted layout pattern data D1 by using the $P^+$ diffusion region information of the various extraction rules D7, to output the $V_{DD}$ wire direct connected $P^+$ diffusion region extracted layout pattern data D1 to the $N^+$ diffusion region extracting portion 14.

In the step S14, the $N^+$ diffusion region extracting portion 14 extracts an $N^+$ diffusion region 156 connected directly to the $V_{DD}$ wire 152 among $N^+$ diffusion regions formed in the upper portion of the $N^-$ well region 153 from the $V_{DD}$ wire direct connected $P^+$ diffusion region extracted layout pattern data D1 by using the $N^+$ diffusion region information of the various extraction rules D7, to output the $V_{DD}$ wire direct connected $P^+$ and $N^+$ diffusion region extracted layout pattern data D1 to the oversize region establishing portion 15.

In the step S15, the oversize information providing portion 18 outputs the oversize establishing data D8 serving as verifying data to the oversize region establishing portion 15. The oversize region establishing portion 15 establishes a square oversize region 157 specified by the oversize establishing data D8 about the $V_{DD}$ wire direct connected $P^+$ diffusion region 154 from the $V_{DD}$ wire direct connected $N^+$ diffusion region extracted layout pattern data D1 by using the oversize establishing data D8, to output the oversize region established layout pattern data D10 to the latch-up verifying portion 16.

In the step S16, the latch-up verifying portion 16 verifies the presence of the $V_{DD}$ wire direct connected $N^+$ diffusion region 156 in the oversize region 157 from the oversize region established layout pattern data D10. If present, the latch-up verifying portion 16 determines that there is no danger of latch-up. If absent, the latch-up verifying portion 16 determines that the distance between the $V_{DD}$ wire direct connected $N^+$ and $P^+$ diffusion regions has the danger of the latch-up occurrence.

In FIG. 5, for example, the whole $V_{DD}$ wire direct connected $N^+$ diffusion region 156 lies within the oversize region 157, so that it is determined that there is no danger of the latch-up occurrence. In FIG. 6, a part of the $V_{DD}$ wire direct connected $N^+$ diffusion region 156 lies within the oversize region 157, so that it is determined that there is no danger of the latch-up occurrence. In FIG. 7, the $V_{DD}$ wire direct connected $N^+$ diffusion region 156 does not in the least lie within the oversize region 157, so that it is determined that there is the danger of the latch-up occurrence.

The determination result is outputted as the latch-up verification result data D9 to the verification result output portion 17.

In the step S17, the verification result output portion 17 outputs the verification result information (not shown) in the form of a list or graphical output on the basis of the latch-up verification result data D9.

The latch-up verification device of the second preferred embodiment, as described hereinabove, verifies the distance between the $P^+$ and $N^+$ diffusion regions connected directly to the $V_{DD}$ wire to thereby automatically verify the layout pattern in which there is the highly possible danger of the latch-up occurrence.

Third Preferred Embodiment

Figure 8:
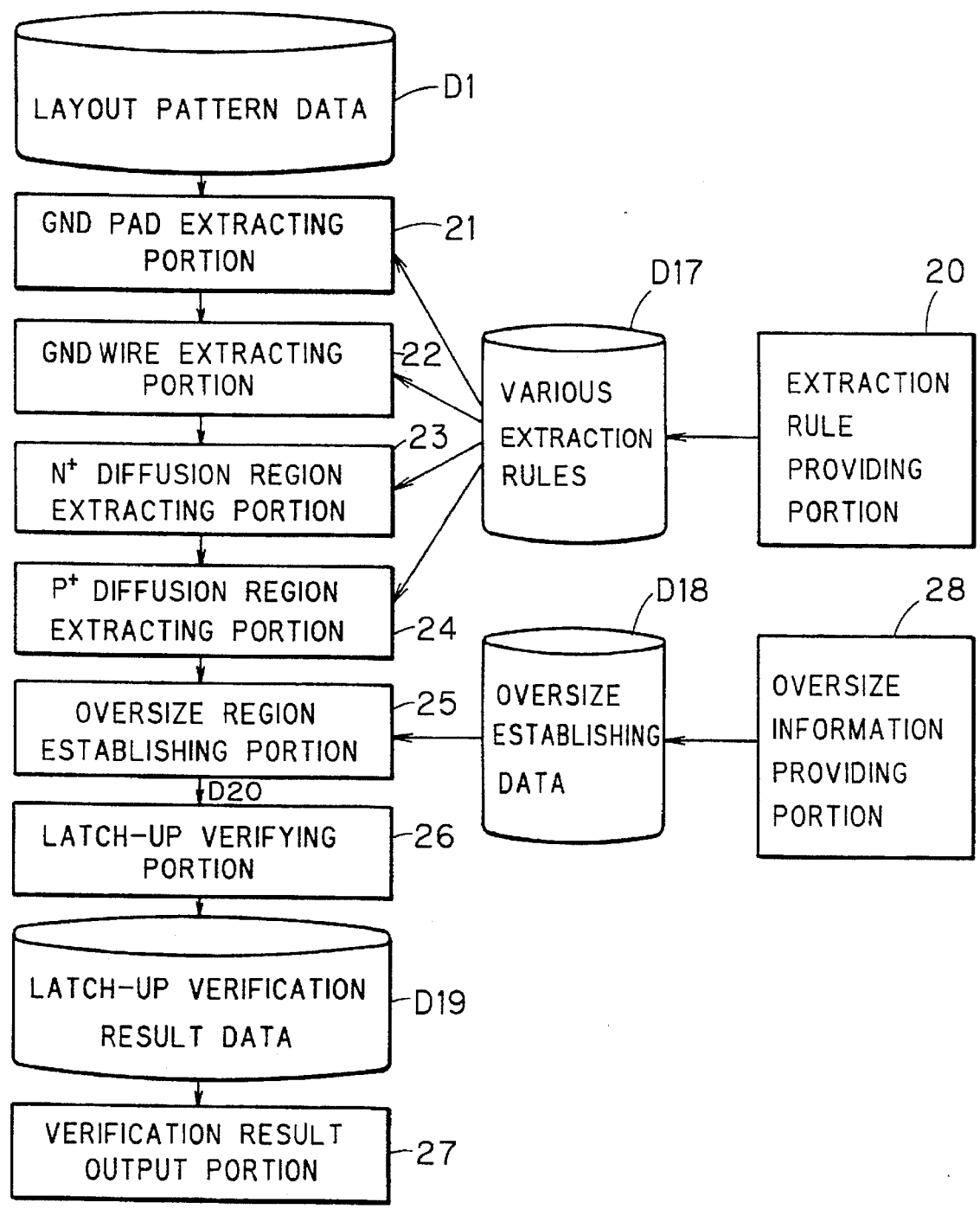
FIG. 8 is a block diagram of the latch-up verification device according to a third preferred embodiment of the present invention.

FIG. 8 is a block diagram of the latch-up verification device according to a third preferred embodiment of the present invention.

Referring to FIG. 8, various extraction rules D17 including GND pad information, GND wire information, $N^+$ diffusion region information and $P^+$ diffusion region information are outputted from an extraction rule providing portion 20 to a GND pad extracting portion 21, a GND wire extracting portion 22, an $N^+$ diffusion region extracting portion 23 and a $P^+$ diffusion region extracting portion 24.

The GND pad extracting portion 21 receives the layout pattern data D1 from the layout pattern data providing means (not shown) and extracts a GND pad from the layout pattern data D1 by using the GND pad information of the various extraction rules D17 to output the GND pad extracted layout pattern data D1 to the GND wire extracting portion 22.

The GND wire extracting portion 22 extracts a GND wire extending from the GND pad from the GND pad extracted layout pattern data D1 by using the GND wire information of the various extraction rules D17 to output the GND wire extracted layout pattern data D1 to the $N^+$ diffusion region extracting portion 23.

The $N^+$ diffusion region extracting portion 23 extracts an $N^+$ diffusion region which is formed in the upper portion of the $P^-$ well region (or $P^-$ substrate) and is connected directly to the GND wire from the GND wire extracted layout pattern data D1 by using the $N^+$ diffusion region information of the various extraction rules D17, to output the GND wire direct connected $N^+$ diffusion region extracted layout pattern data D1 to the $P^+$ diffusion region extracting portion 24.

The $P^+$ diffusion region extracting portion 24 extracts a $P^+$ diffusion region which is formed in the upper portion of the P⁻ well region (or P⁻ substrate) and is connected directly to the GND wire from the GND wire direct connected $N^+$ diffusion region extracted layout pattern data D1 by using the $P^+$ diffusion region information of the various extraction rules D17, to output the GND wire direct connected $P^+$ and $N^+$ diffusion region extracted layout pattern data D1 to an oversize region establishing portion 25.

An oversize information providing portion 28 outputs oversize establishing data D18 serving as verifying data to the oversize region establishing portion 25. It should be noted that the oversize establishing data D18 is determined as a function of the impurity concentrations of the semiconductor substrate and the well region.

The oversize region establishing portion 25 establishes a square oversize region of a size specified by the oversize establishing data D18 about the GND wire direct connected $N^+$ diffusion region from the GND wire direct connected $P^+$ and $N^+$ diffusion region extracted layout pattern data D1 by using the oversize establishing data D18, to output oversize region established layout pattern data D20 to a latch-up verifying portion 26.

The latch-up verifying portion 26 verifies the presence of the GND wire direct connected $P^+$ diffusion region in the oversize region from the oversize region established layout pattern data D20. If present, the latch-up verifying portion 26 determines that there is no danger of latch-up. If absent, the latch-up verifying portion 26 determines that the distance between the GND wire direct connected $N^+$ and $P^+$ diffusion regions has the danger of the latch-up occurrence. Then the latch-up verifying portion 26 outputs to a verification result output portion 27 latch-up verification result data D19 containing a pair of GND wiring direct connected $N^+$ and $P^+$ diffusion regions which have been determined to have the danger of the latch-up occurrence.

The details of the latch-up verification will be described hereinafter using the CMOS structure of FIG. 29 as an example. The $P^+$ diffusion region 108 and the $N^+$ diffusion region 106, which are connected directly to the GND level but which are adjacent to each other, are not a problem. If the $P^+$ diffusion region 108 is spaced from the $N^+$ diffusion region 106 a distance that is too long for the $P^+$ diffusion region 108 to lie within the oversize region about the $N^+$ diffusion region 106, a potential difference is prone to be generated between the $N^+$ diffusion region 106 and the $P^+$ diffusion region 108. There is the highly possible danger of the latch-up occurrence. That is, the parasitic NPN bipolar transistor T2 in the circuit of FIG. 30 is prone to turn on.

The verification result output portion 27 outputs verification result information (not shown) in the form of a list or graphical output on the basis of the latch-up verification result data D19.

Figure 9:
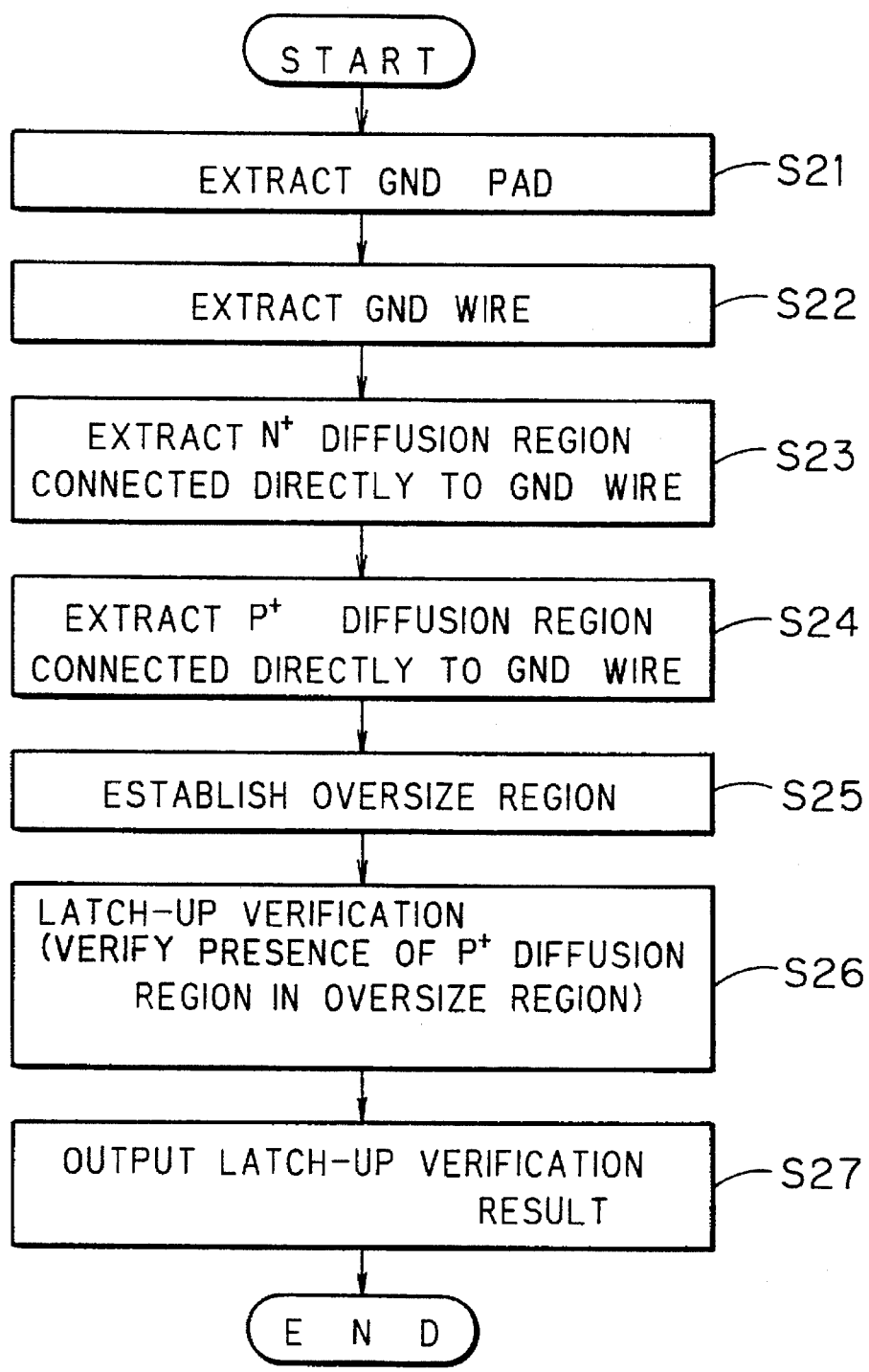
FIG. 9 is a flow chart showing the operation of the latch-up verification device of the third preferred embodiment.
Figure 10:
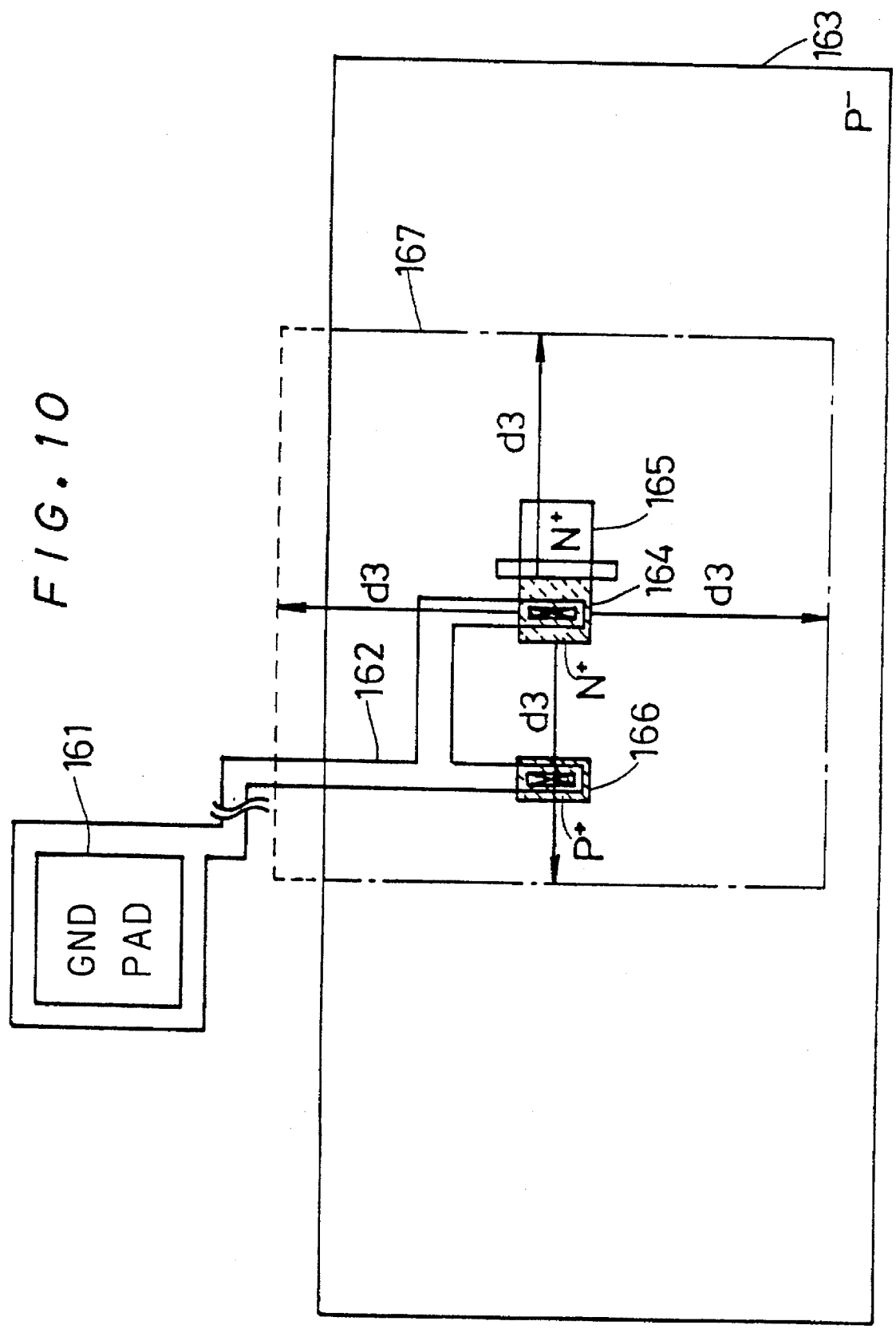
FIGS. 10 to 12 are plan views of layout patterns for delineating the operation of the latch-up verification device of the third preferred embodiment.
Figure 11:
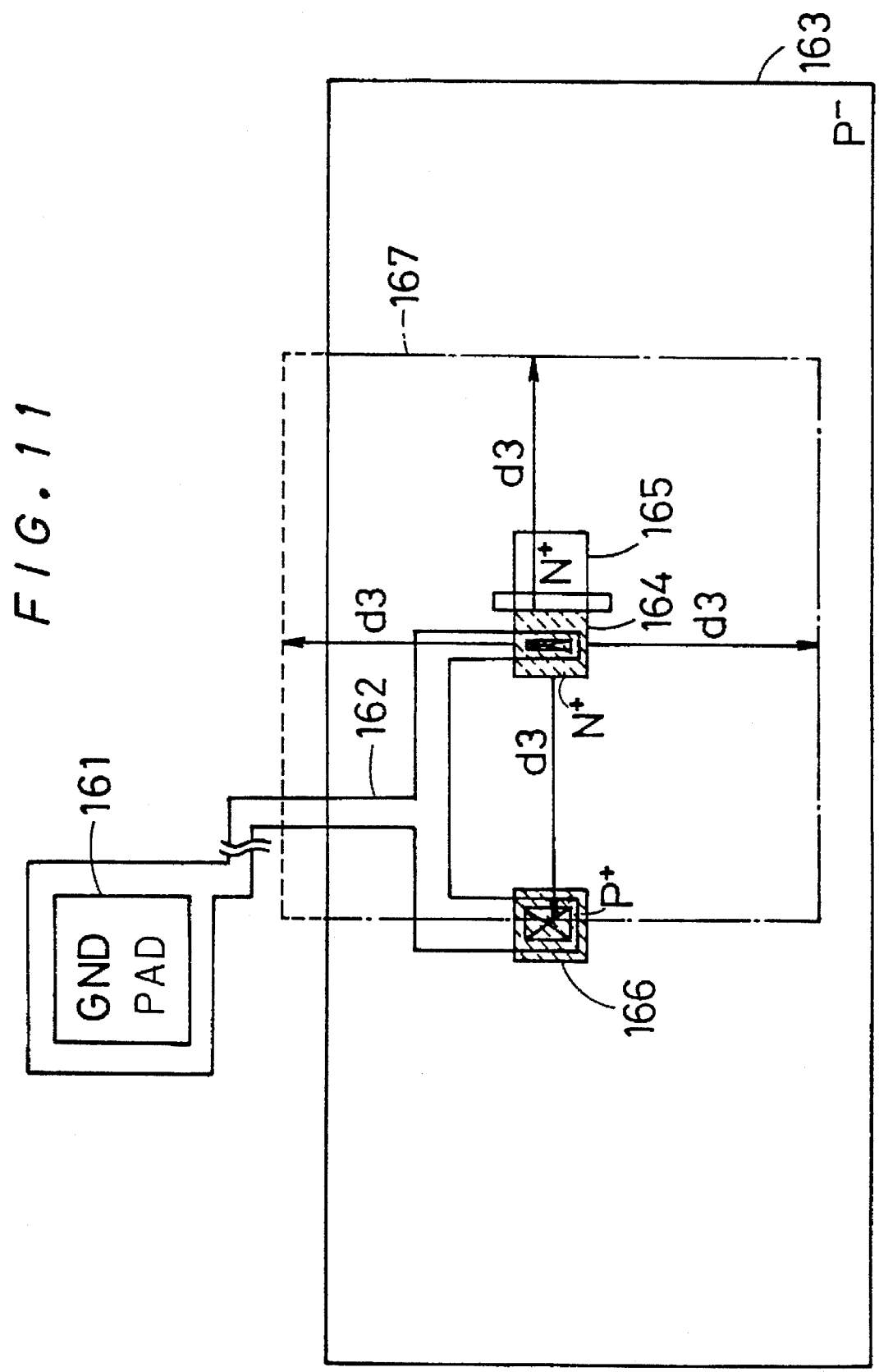
Figure 12:
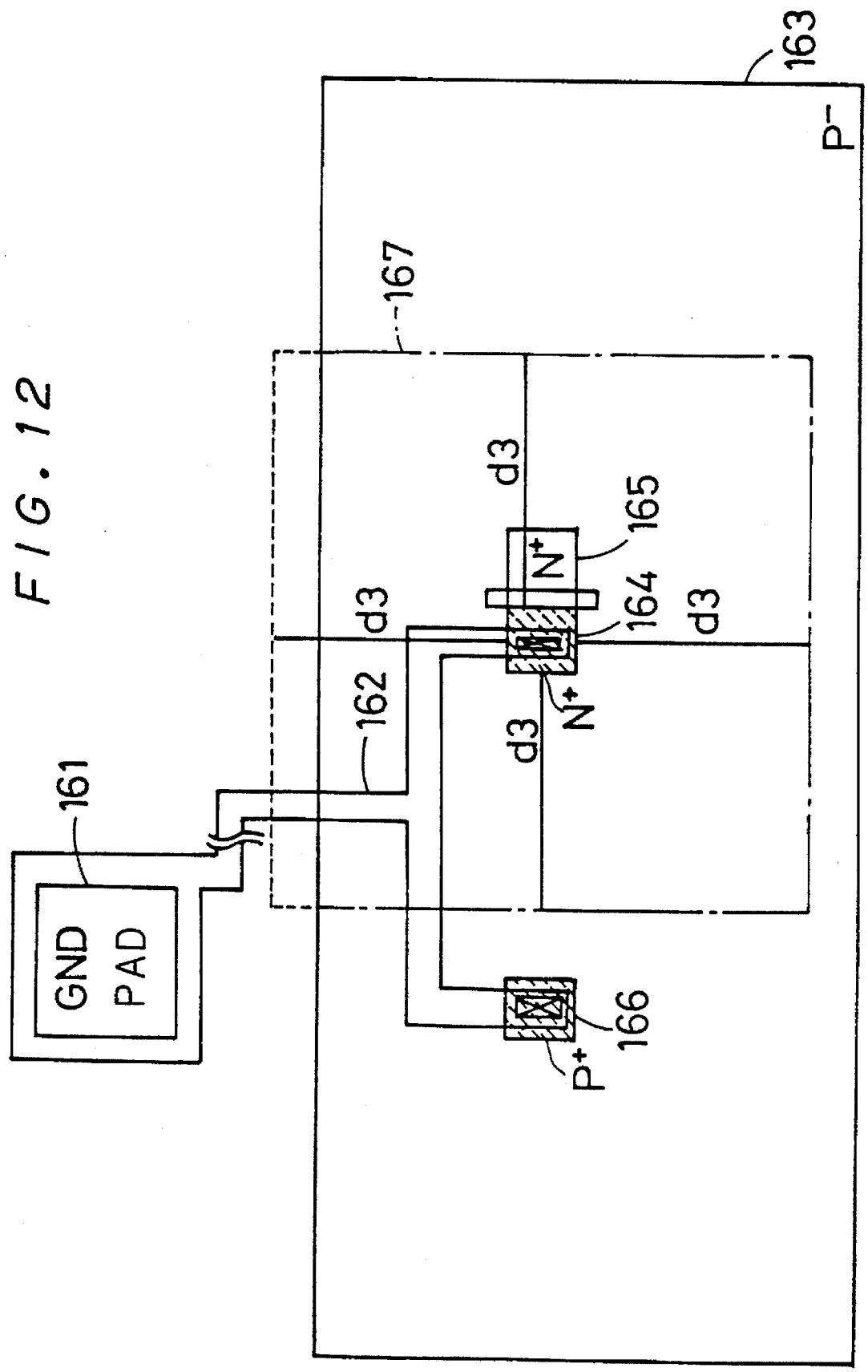

FIG. 9 is a flow chart of the operation of the latch-up verification device of the third preferred embodiment. FIGS. 10 to 12 are plan views for delineating the operation of the latch-up verification device. Referring to FIGS. 9 to 12, the verification operation will be discussed hereinafter.

In the step S21, the GND pad extracting portion 21 extracts a GND pad 161 from the layout pattern data D1 by using the GND pad information of the various extraction rules D17 to output the GND pad extracted layout pattern data D1 to the GND wire extracting portion 22.

In the step S22, the GND wire extracting portion 22 extracts a GND wire 162 extending from the GND pad 161 from the GND pad extracted layout pattern data D1 by using the GND wire information of the various extraction rules D17 to output the GND wire extracted layout pattern data D1 to the $N^+$ diffusion region extracting portion 23.

In the step S23, the $N^+$ diffusion region extracting portion 23 extracts an $N^+$ diffusion region 164 connected directly to the GND wire 162 among $N^+$ diffusion regions 164 and 165 formed in the upper portion of a P⁻ well region 163 (or P⁻ substrate) from the GND wire extracted layout pattern data D1 by using the $N^+$ diffusion region information of the various extraction rules D17, to output the GND wire direct connected $N^+$ diffusion region extracted layout pattern data D1 to the $P^+$ diffusion region extracting portion 24.

In the step S24, the $P^+$ diffusion region extracting portion 24 extracts a $P^+$ diffusion region 166 connected directly to the GND wire 162 among $P^+$ diffusion regions formed in the upper portion of the P⁻ well region 163 from the GND wire direct connected $N^+$ diffusion region extracted layout pattern data D1 by using the $P^+$ diffusion region information of the various extraction rules D17, to output the GND wire direct connected $P^+$ and $N^+$ diffusion region extracted layout pattern data D1 to the oversize region establishing portion 25.

In the step S25, the oversize information providing portion 28 outputs the oversize establishing data D18 serving as verifying data to the oversize region establishing portion 25. The oversize region establishing portion 25 establishes a square oversize region 167 specified by the oversize establishing data D18 about the GND wire direct connected $N^+$ diffusion region 164 from the GND wire direct connected $P^+$ and $N^+$ diffusion region extracted layout pattern data D1 by using the oversize establishing data D18, to output the oversize region established layout pattern data D20 to the latch-up verifying portion 26.

In the step S26, the latch-up verifying portion 26 verifies the presence of the GND wire direct connected $P^+$ diffusion region 166 in the oversize region 167 from the oversize region established layout pattern data D20. If present, the latch-up verifying portion 26 determines that there is no danger of latch-up. If absent, the latch-up verifying portion 26 determines that the distance between the GND wire direct connected $N^+$ and $P^+$ diffusion regions has the danger of the latch-up occurrence.

In FIG. 10, for example, the whole GND wire direct connected $P^+$ diffusion region 166 lies within the oversize region 167, so that it is determined that there is no danger of the latch-up occurrence. In FIG. 11, a part of the GND wire direct connected $P^+$ diffusion region 166 lies within the oversize region 167, so that it is determined that there is no danger of the latch-up occurrence. In FIG. 12, the GND wire direct connected $P^+$ diffusion region 166 does not in the least lie within the oversize region 167, so that it is determined that there is the danger of the latch-up occurrence.

The determination result is outputted as the latch-up verification result data D19 to the verification result output portion 27.

In the step S27, the verification result output portion 27 outputs the verification result information (not shown) in the form of a list or graphical output on the basis of the latch-up verification result data D19.

The latch-up verification device of the third preferred embodiment, as described hereinabove, verifies the distance between the $P^+$ and $N^+$ diffusion regions connected directly to the GND wire to thereby automatically verify the layout pattern in which there is the highly possible danger of the latch-up occurrence.

Fourth Preferred Embodiment

Figure 13:
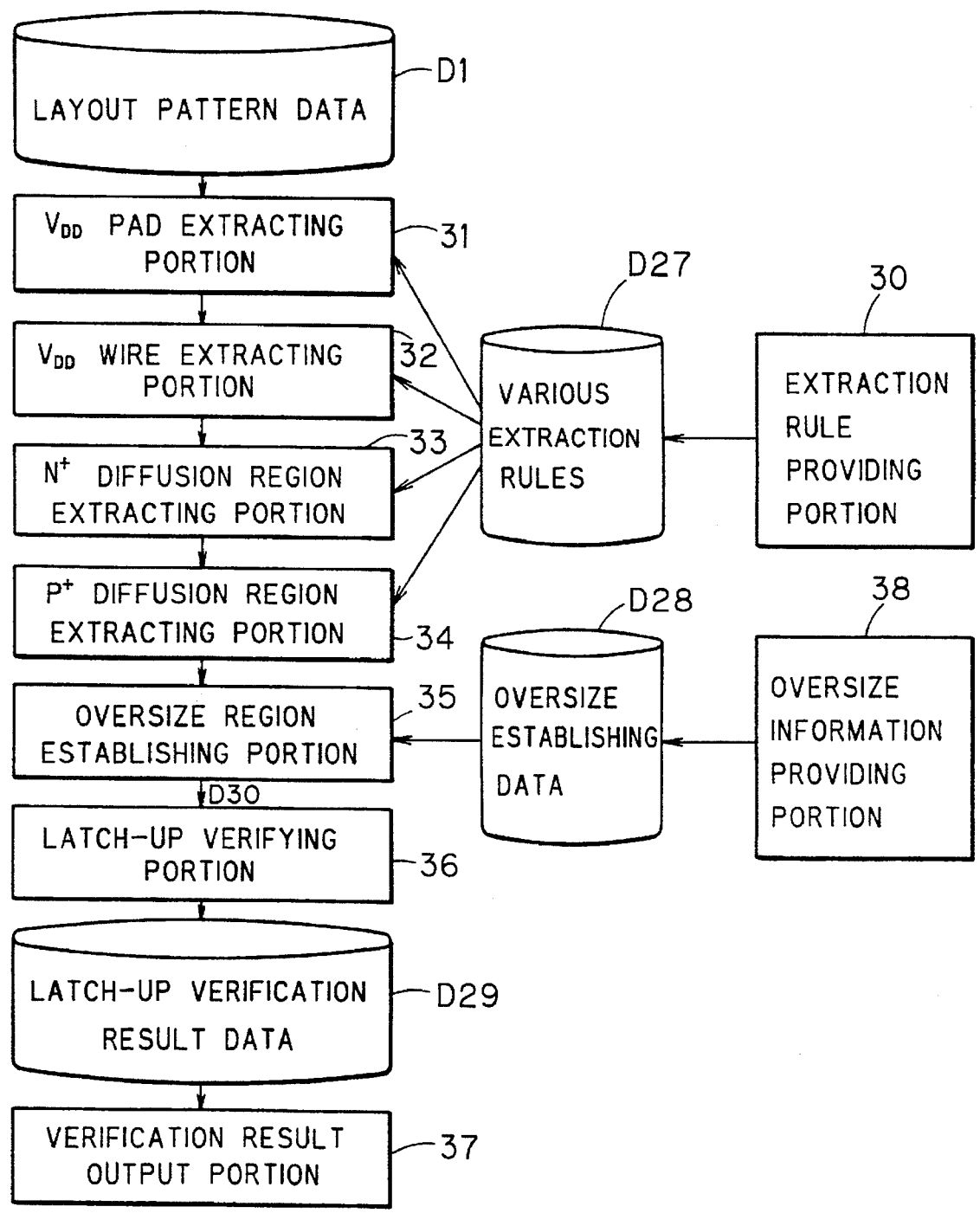
FIG. 13 is a block diagram of the latch-up verification device according to a fourth preferred embodiment of the present invention.

FIG. 13 is a block diagram of the latch-up verification device according to a fourth preferred embodiment of the present invention.

Referring to FIG. 13, various extraction rules D27 including $V_{DD}$ pad information, $V_{DD}$ wire information, $P^+$ diffusion region information and $N^+$ diffusion region information are outputted from an extraction rule providing portion 30 to a $V_{DD}$ pad extracting portion 31, a $V_{DD}$ wire extracting portion 32, an $N^+$ diffusion region extracting portion 33 and a $P^+$ diffusion region extracting portion 34.

The $V_{DD}$ pad extracting portion 31 receives the layout pattern data D1 from the layout pattern data providing means (not shown) and extracts a $V_{DD}$ pad from the layout pattern data D1 by using the $V_{DD}$ pad information of the various extraction rules D27 to output the $V_{DD}$ pad extracted layout pattern data D1 to the $V_{DD}$ wire extracting portion 32. The $V_{DD}$ wire extracting portion 32 extracts a $V_{DD}$ wire extending from the $V_{DD}$ pad from the $V_{DD}$ pad extracted layout pattern data D1 by using the $V_{DD}$ wire information of the various extraction rules D27 to output the $V_{DD}$ wire extracted layout pattern data D1 to the $N^+$ diffusion region extracting portion 33.

The $N^+$ diffusion region extracting portion 33 extracts an $N^+$ diffusion region which is formed in the upper portion of the $N^-$ well region (or $N^-$ substrate) and is connected directly to the $V_{DD}$ wire from the $V_{DD}$ wire extracted layout pattern data D1 by using the $N^+$ diffusion region information of the various extraction rules D27, to output the $V_{DD}$ wire direct connected $N^+$ diffusion region extracted layout pattern data D1 to the $P^+$ diffusion region extracting portion 34.

The $P^+$ diffusion region extracting portion 34 extracts a $P^+$ diffusion region which is formed in the upper portion of the $N^-$ well region (or $N^-$ substrate) and is connected directly to the $V_{DD}$ wire from the $V_{DD}$ wire direct connected $N^+$ diffusion region extracted layout pattern data D1 by using the $P^+$ diffusion region information of the various extraction rules D27, to output the $V_{DD}$ wire direct connected $P^+$ and $N^+$ diffusion region extracted layout pattern data D1 to an oversize region establishing portion 35.

An oversize information providing portion 38 outputs oversize establishing data D28 serving as verifying data to the oversize region establishing portion 35. It should be noted that the oversize establishing data D28 is determined as a function of the impurity concentrations of the semiconductor substrate and the well region.

The oversize region establishing portion 35 establishes a square oversize region of a size specified by the oversize establishing data D28 about the $V_{DD}$ wire direct connected $N^+$ diffusion region from the $V_{DD}$ wire direct connected $P^+$ and $N^+$ diffusion region extracted layout pattern data D1 by using the oversize establishing data D28, to output oversize region established layout pattern data D30 to a latch-up verifying portion 36.

The latch-up verifying portion 36 detects the presence of the $V_{DD}$ wire direct connected $P^+$ diffusion region which does not lie in any oversize regions from the oversize region established layout pattern data D30. If it is not detected, the latch-up verifying portion 36 determines that there is no danger of latch-up. If detected, the latch-up verifying portion 36 determines that the distance between the $V_{DD}$ wire direct connected $N^+$ and $P^+$ diffusion regions has the danger of the latch-up occurrence. Then the latch-up verifying portion 36 outputs to a verification result output portion 37 latch-up verification result data D29 containing a pair of $V_{DD}$ wire direct connected $N^+$ and $P^+$ diffusion regions which have been determined to have the danger of the latch-up occurrence. Therefore, the latch-up verification operation of the fourth preferred embodiment is for the same purpose of verification as that of the second preferred embodiment.

The verification result output portion 37 outputs verification result information (not shown) in the form of a list or graphical output on the basis of the latch-up verification result data D29.

Figure 14:
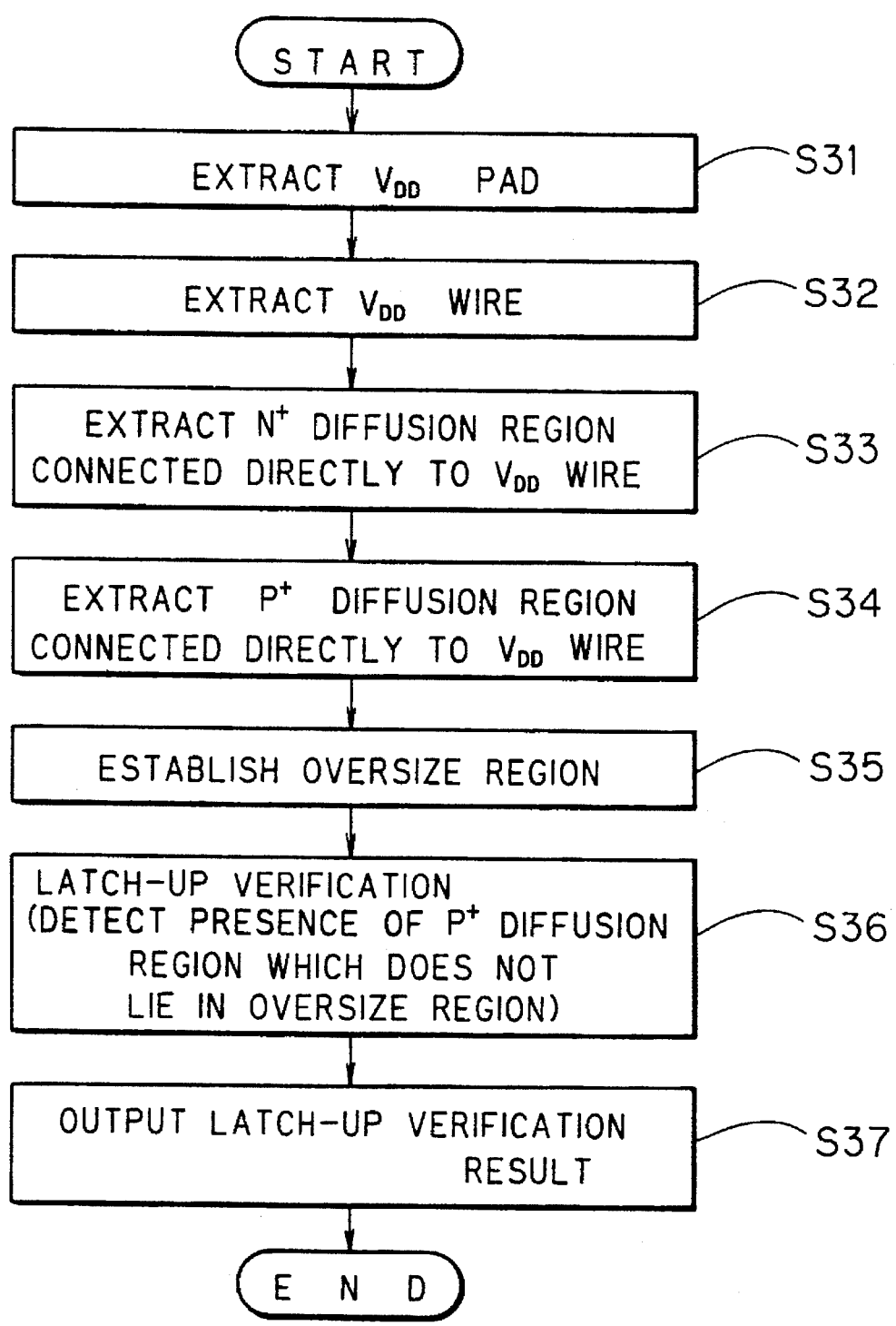
FIG. 14 is a flow chart showing the operation of the latch-up verification device of the fourth preferred embodiment.
Figure 15:
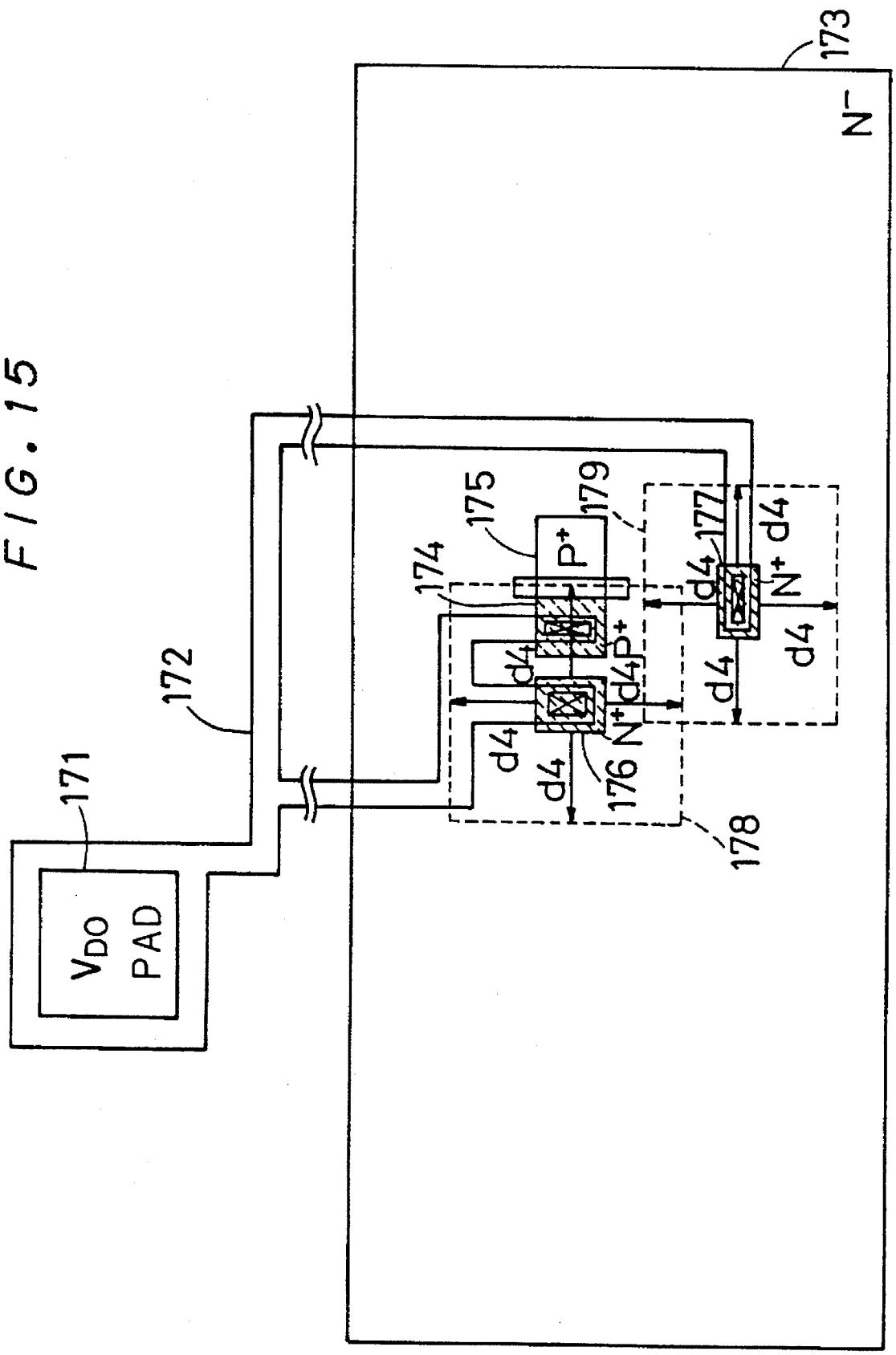
FIGS. 15 to 17 are plan views of layout patterns for delineating the operation of the latch-up verification device of the fourth preferred embodiment.
Figure 16:
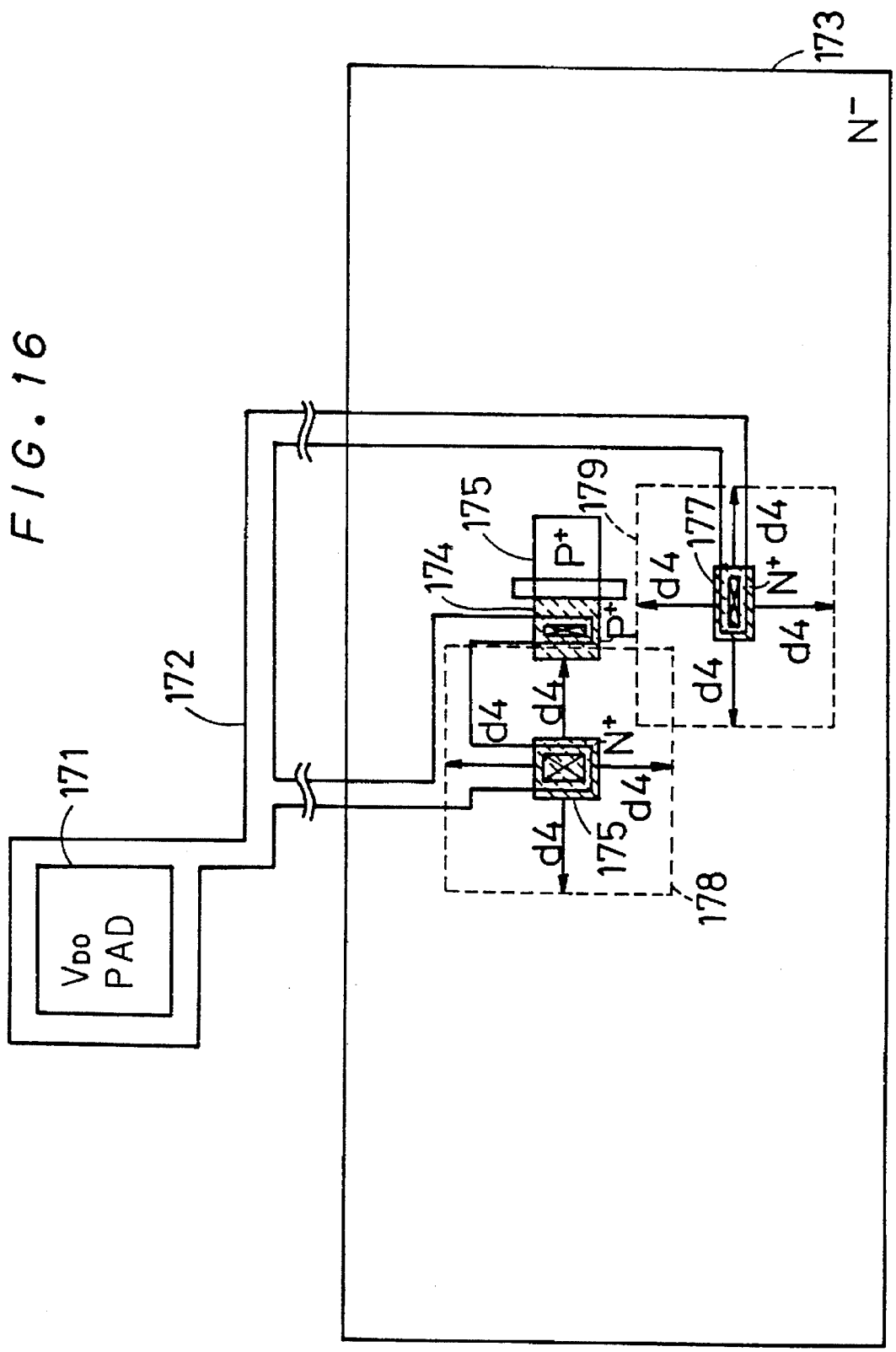
Figure 17:
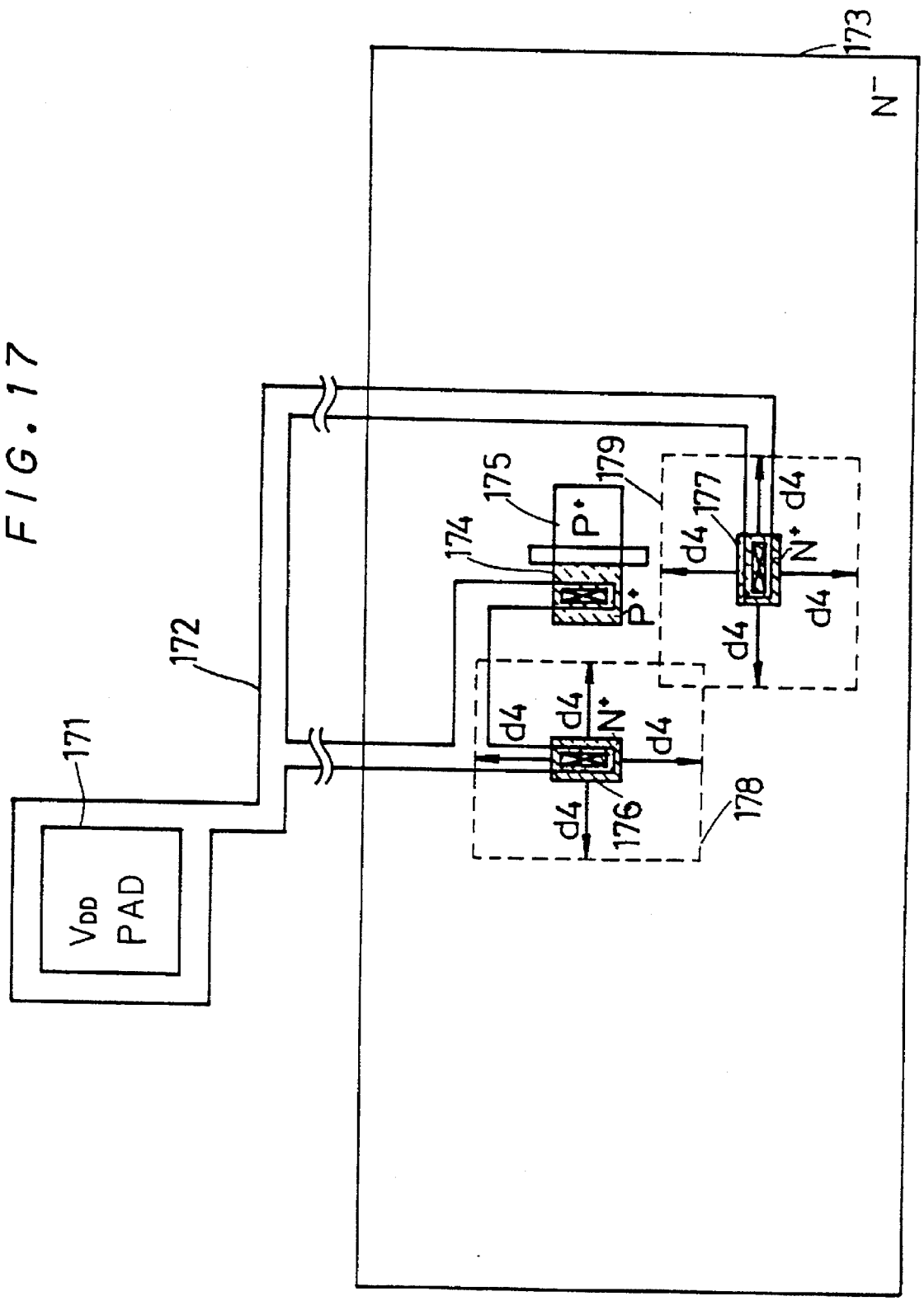

FIG. 14 is a flow chart of the operation of the latch-up verification device of the fourth preferred embodiment. FIGS. 15 to 17 are plan views for delineating the operation of the latch-up verification device. Referring to FIGS. 14 to 17, the verification operation will be discussed hereinafter.

In the step S31, the $V_{DD}$ pad extracting portion 31 extracts a $V_{DD}$ pad 171 from the layout pattern data D1 by using the $V_{DD}$ pad information of the various extraction rules D27 to output the $V_{DD}$ pad extracted layout pattern data D1 to the $V_{DD}$ wire extracting portion 32.

In the step S32, the $V_{DD}$ wire extracting portion 32 extracts a $V_{DD}$ wire 172 extending from the $V_{DD}$ pad 171 from the $V_{DD}$ pad extracted layout pattern data D1 by using the $V_{DD}$ wire information of the various extraction rules D27 to output the $V_{DD}$ wire extracted layout pattern data D1 to the $N^+$ diffusion region extracting portion 33.

In the step S33, the $N^+$ diffusion region extracting portion 33 extracts $N^+$ diffusion regions 176, 177 connected directly to the $V_{DD}$ wire 172 among the $N^+$ diffusion regions 176, 177 formed in the upper portion of an $N^-$ well region 173 (or $N^-$ substrate) from the $V_{DD}$ wire extracted layout pattern data D1 by using the $N^+$ diffusion region information of the various extraction rules D27, to output the $V_{DD}$ wire direct connected $N^+$ diffusion region extracted layout pattern data D1 to the $P^+$ diffusion region extracting portion 34.

In the step S34, the $P^+$ diffusion region extracting portion 34 extracts a $P^+$ diffusion region 174 connected directly to the $V_{DD}$ wire 172 among $P^+$ diffusion regions 174, 175 formed in the upper portion of the $N^-$ well region 173 from the $V_{DD}$ wire direct connected $N^+$ diffusion region extracted layout pattern data D1 by using the $P^+$ diffusion region information of the various extraction rules D27, to output the $V_{DD}$ wire direct connected $P^+$ and $N^+$ diffusion region extracted layout pattern data D1 to the oversize region establishing portion 35.

In the step S35, the oversize information providing portion 38 outputs the oversize establishing data D28 serving as verifying data to the oversize region establishing portion 35. The oversize region establishing portion 35 establishes square oversize regions 178, 179 specified by the oversize establishing data D28 about the $V_{DD}$ wire direct connected $N^+$ diffusion regions 176, 177, respectively, from the $V_{DD}$ wire direct connected $P^+$ and $N^+$ diffusion region extracted layout pattern data D1 by using the oversize establishing data D28, to output the oversize region established layout pattern data D30 to the latch-up verifying portion 36.

In the step S36, the latch-up verifying portion 36 detects the presence of the $V_{DD}$ wire direct connected $P^+$ diffusion region 174 which does not lie in the oversize regions 178 and 179 and is connected directly to the $V_{DD}$ wire 172 from the oversize region established layout pattern data D30. If it is not detected, the latch-up verifying portion 36 determines that there is no danger of latch-up. If detected, the latch-up verifying portion 36 determines that the distance between the $V_{DD}$ wire direct connected $N^+$ and $P^+$ diffusion regions has the danger of the latch-up occurrence.

In FIG. 15, for example, the whole $V_{DD}$ wire direct connected $P^+$ diffusion region 174 lies within the oversize regions 178 and 179, so that it is determined that there is no danger of the latch-up occurrence in relation to the $P^+$ diffusion region 174. In FIG. 16, a part of the $V_{DD}$ wire direct connected $P^+$ diffusion region 174 lies within the oversize regions 178 and 179, so that it is determined that there is no danger of the latch-up occurrence in relation to the P$^+$ diffusion region 174. In FIG. 17, the V$_{DD}$ wire direct connected P$^+$ diffusion region 174 does not in the least lie within the oversize regions 178 and 179, so that it is determined that there is the danger of the latch-up occurrence in relation to the P$^+$ diffusion region 174.

The determination result is outputted as the latch-up verification result data D29 to the verification result output portion 37.

In the step S37, the verification result output portion 37 outputs the verification result information (not shown) in the form of a list or graphical output on the basis of the latch-up verification result data D29.

The latch-up verification device of the fourth preferred embodiment, in the same fashion as the second preferred embodiment, verifies the distance between the P$^+$ and N$^+$ diffusion regions connected directly to the V$_{DD}$ wire to thereby automatically verify the layout pattern in which there is the highly possible danger of the latch-up occurrence.

Fifth Preferred Embodiment

Figure 18:
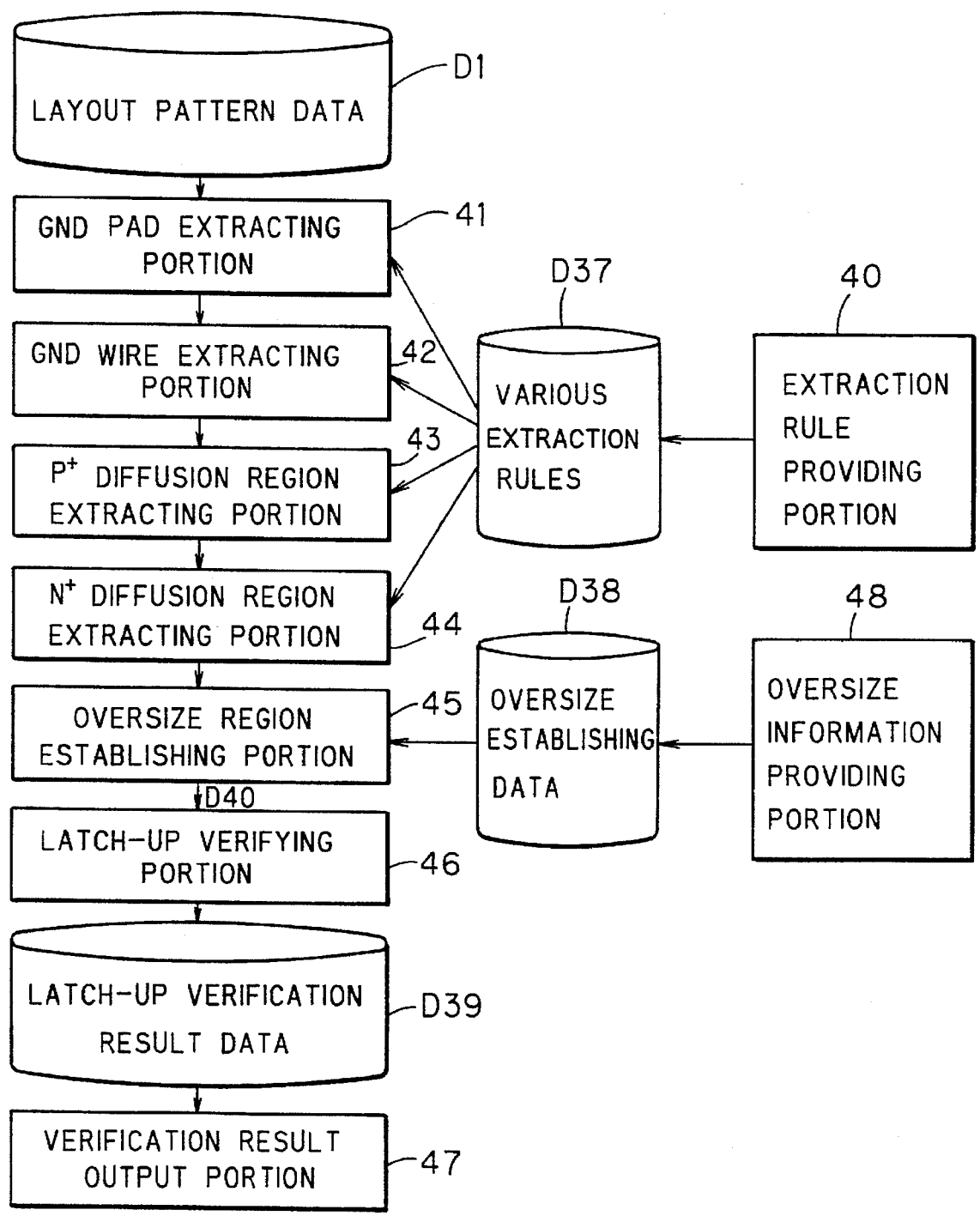
FIG. 18 is a block diagram of the latch-up verification device according to a fifth preferred embodiment of the present invention.

FIG. 18 is a block diagram of the latch-up verification device according to a fifth preferred embodiment of the present invention.

Referring to FIG. 18, various extraction rules D37 including GND pad information, GND wire information, P$^+$ diffusion region information and N$^+$ diffusion region information are outputted from an extraction rule providing portion 40 to a GND pad extracting portion 41, a GND wire extracting portion 42, a P$^+$ diffusion region extracting portion 43 and an N$^+$ diffusion region extracting portion 44.

The GND pad extracting portion 41 receives the layout pattern data D1 from the layout pattern data providing means (not shown) and extracts a GND pad from the layout pattern data D1 by using the GND pad information of the various extraction rules D37 to output the GND pad extracted layout pattern data D1 to the GND wire extracting portion 42.

The GND wire extracting portion 42 extracts a GND wire extending from the GND pad from the GND pad extracted layout pattern data D1 by using the GND wire information of the various extraction rules D37 to output the GND wire extracted layout pattern data D1 to the P$^+$ diffusion region extracting portion 43.

The P$^+$ diffusion region extracting portion 43 extracts a P$^+$ diffusion region which is formed in the upper portion of the P$^-$ well region (or P$^-$ substrate) and is connected directly to the GND wire from the GND wire extracted layout pattern data D1 by using the P$^+$ diffusion region information of the various extraction rules D37, to output the GND wire direct connected P$^+$ diffusion region extracted layout pattern data D1 to the N$^+$ diffusion region extracting portion 44.

The N$^+$ diffusion region extracting portion 44 extracts an N$^+$ diffusion region which is formed in the upper portion of the P$^-$ well region (or P$^-$ substrate) and is connected directly to the GND wire from the GND wire direct connected P$^+$ diffusion region extracted layout pattern data D1 by using the N$^+$ diffusion region information of the various extraction rules D37, to output the GND wire direct connected P$^+$ and N$^+$ diffusion region extracted layout pattern data D1 to an oversize region establishing portion 45.

An oversize information providing portion 48 outputs oversize establishing data D38 serving as verifying data to the oversize region establishing portion 45. It should be noted that the oversize establishing data D38 is determined as a function of the impurity concentrations of the semiconductor substrate and the well region.

The oversize region establishing portion 45 establishes a square oversize region of a size specified by the oversize establishing data D38 about the GND wire direct connected P$^+$ diffusion region from the GND wire direct connected P$^+$ and N$^+$ diffusion region extracted layout pattern data D1 by using the oversize establishing data D38, to output oversize region established layout pattern data D40 to a latch-up verifying portion 46.

The latch-up verifying portion 46 detects the presence of the GND wire direct connected N$^+$ diffusion region which does not lie in any oversize regions from the oversize region established layout pattern data D40. If it is not detected, the latch-up verifying portion 46 determines that there is no danger of latch-up. If detected, the latch-up verifying portion 46 determines that the distance between the GND wire direct connected N$^+$ and P$^+$ diffusion regions has the danger of the latch-up occurrence. Then the latch-up verifying portion 46 outputs to a verification result output portion 47 latch-up verification result data D39 containing a pair of GND wire direct connected N$^+$ and P$^+$ diffusion regions which have been determined to have the danger of the latch-up occurrence. The latch-up verification operation of the fifth preferred embodiment is for the same purpose of verification as that of the third preferred embodiment.

The verification result output portion 47 outputs verification result information (not shown) in the form of a list or graphical output on the basis of the latch-up verification result data D39.

Figure 19:
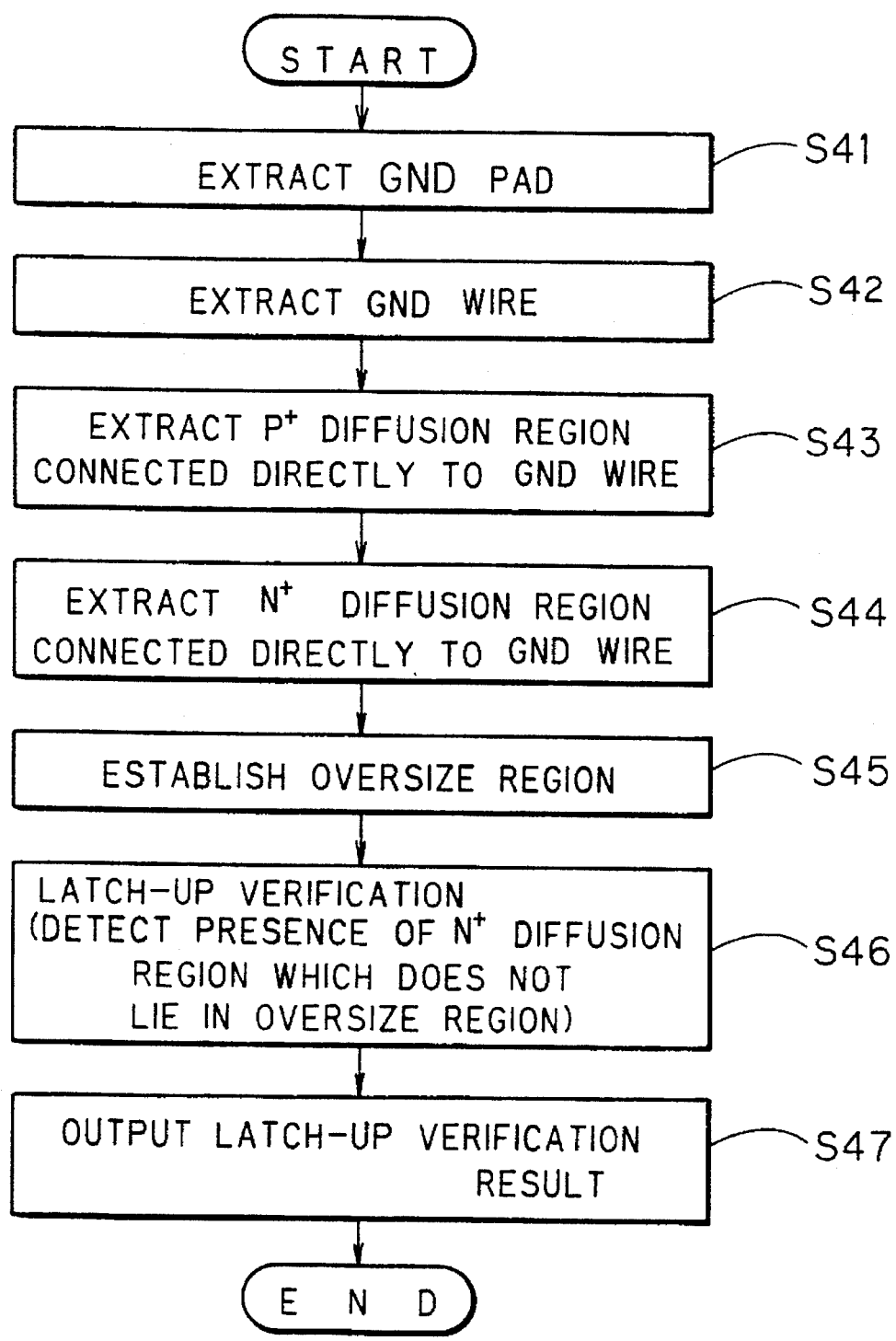
FIG. 19 is a flow chart showing the operation of the latch-up verification device of the fifth preferred embodiment.
Figure 20:
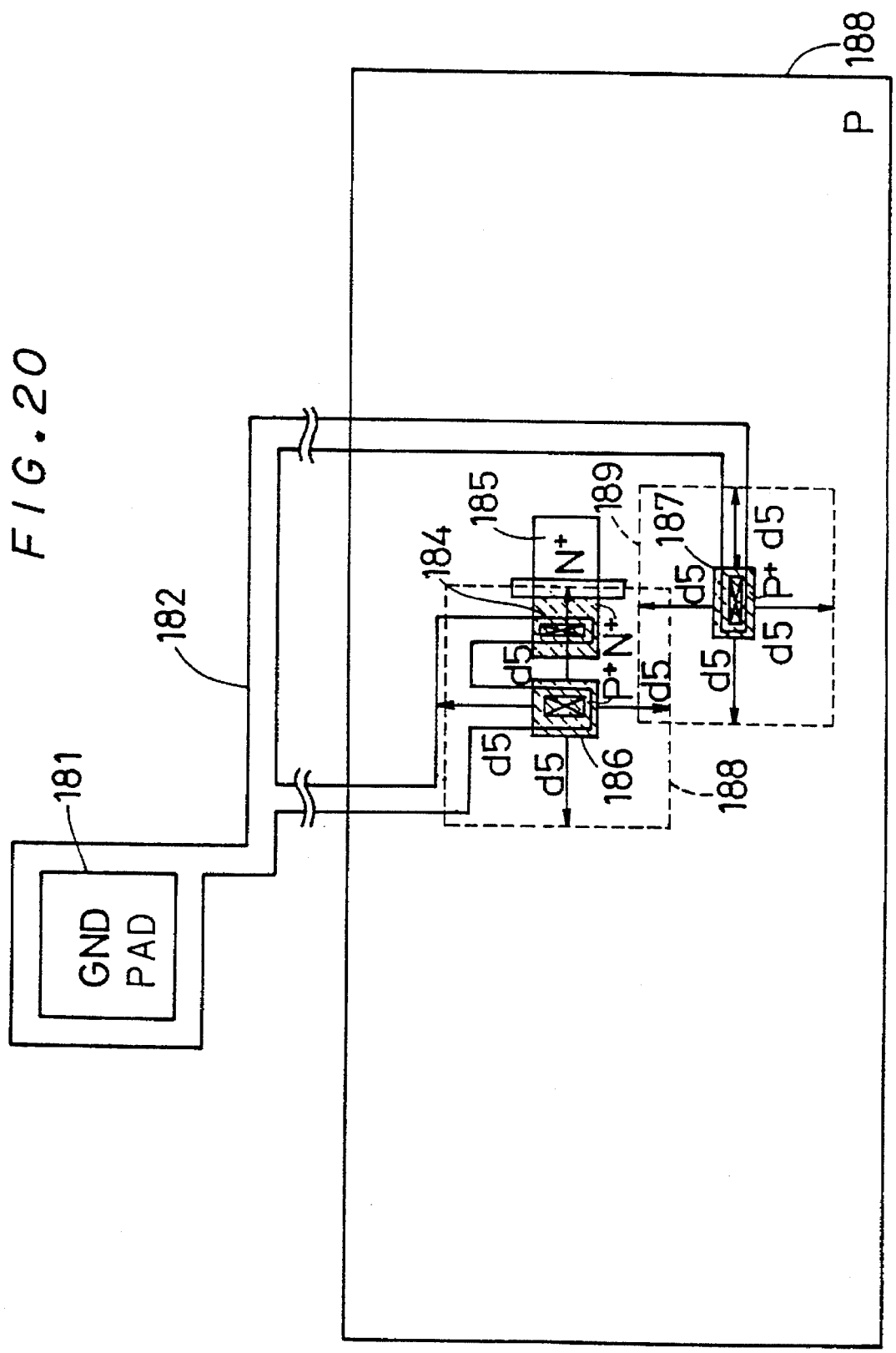
FIGS. 20 to 22 are plan views of layout patterns for delineating the operation of the latch-up verification device of the fifth preferred embodiment.
Figure 21:
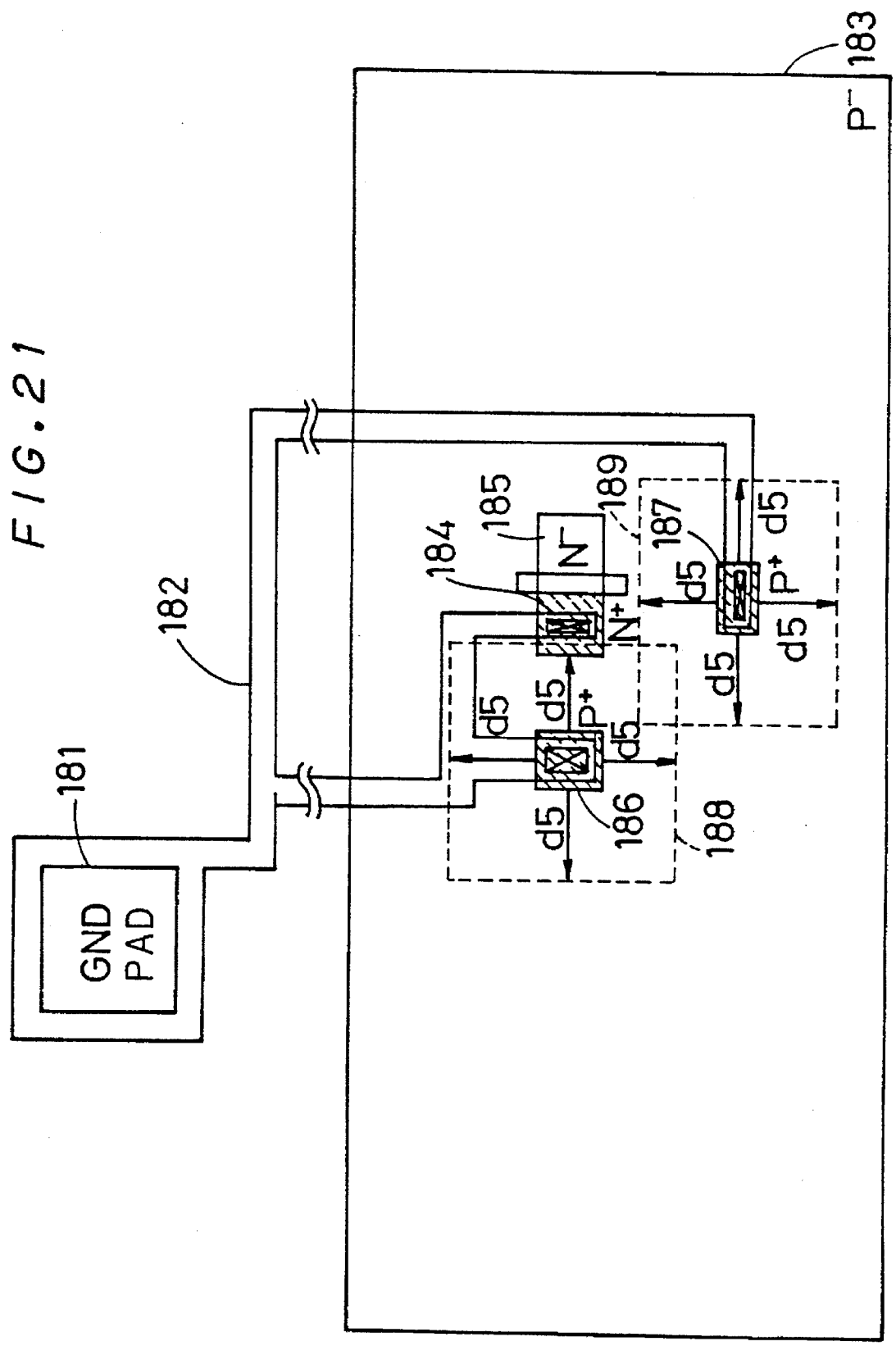
Figure 22:
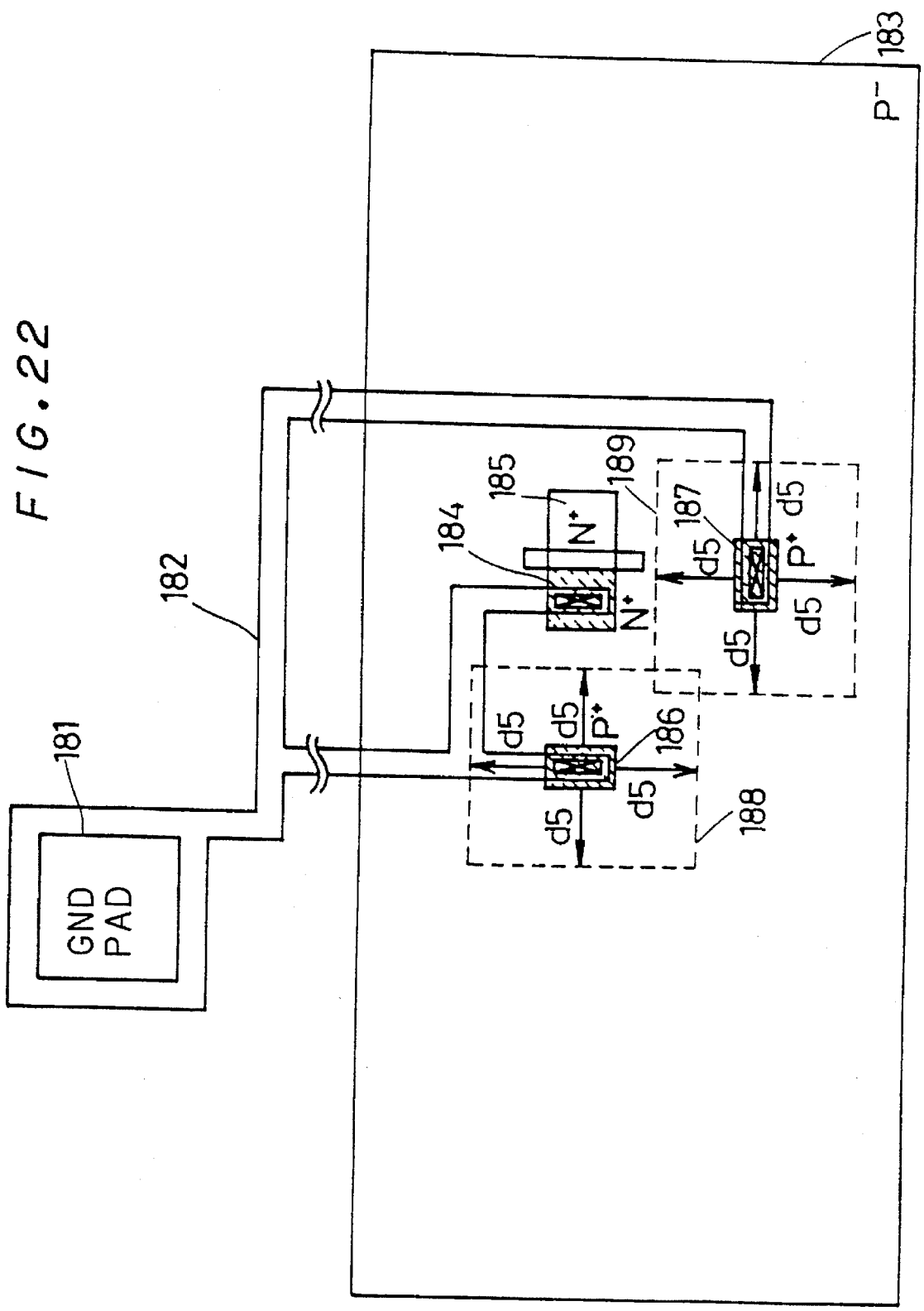

FIG. 19 is a flow chart of the operation of the latch-up verification device of the fifth preferred embodiment. FIGS. 20 to 22 are plan views for delineating the operation of the latch-up verification device. Referring to FIGS. 19 to 22, the verification operation will be discussed hereinafter.

In the step S41, the GND pad extracting portion 41 extracts a GND pad 181 from the layout pattern data D1 by using the GND pad information of the various extraction rules D37 to output the GND pad extracted layout pattern data D1 to the GND wire extracting portion 42.

In the step S42, the GND wire extracting portion 42 extracts a GND wire 182 extending from the GND pad 181 from the GND pad extracted layout pattern data D1 by using the GND wire information of the various extraction rules D37 to output the GND wire extracted layout pattern data D1 to the P$^+$ diffusion region extracting portion 43.

In the step S43, the P$^+$ diffusion region extracting portion 43 extracts P$^+$ diffusion regions 186, 187 connected directly to the GND wire 182 among the P$^+$ diffusion regions 186, 187 formed in the upper portion of a P$^-$ well region 183 (or P$^-$ substrate) from the GND wire extracted layout pattern data D1 by using the P$^+$ diffusion region information of the various extraction rules D37, to output the GND wire direct connected P$^+$ diffusion region extracted layout pattern data D1 to the N$^+$ diffusion region extracting portion 44.

In the step S44, the N$^+$ diffusion region extracting portion 44 extracts an N$^+$ diffusion region 184 connected directly to the GND wire 182 among N$^+$ diffusion regions 184, 185 formed in the upper portion of the P$^-$ well region 183 from the GND wire direct connected P$^+$ diffusion region extracted layout pattern data D1 by using the N$^+$ diffusion region information of the various extraction rules D37, to output the GND wire direct connected P$^+$ and N$^+$ diffusion region extracted layout pattern data D1 to the oversize region establishing portion 45.

In the step S45, the oversize information providing portion 48 outputs the oversize establishing data D38 serving as verifying data to the oversize region establishing portion 45. The oversize region establishing portion 45 establishes square oversize regions 188 and 189 specified by the oversize establishing data D38 about the GND wire direct connected $N^+$ diffusion regions 186 and 187, respectively, from the GND wire direct connected $P^+$ and $N^+$ diffusion region extracted layout pattern data D1 by using the oversize establishing data D38, to output the oversize region established layout pattern data D40 to the latch-up verifying portion 46.

In the step S46, the latch-up verifying portion 46 detects the presence of the $N^+$ diffusion region 184 which does not lie in the oversize regions 188 and 189 and is connected directly to the GND wire 182 from the oversize region established layout pattern data D40. If it is not detected, the latch-up verifying portion 46 determines that there is no danger of latch-up. If detected, the latch-up verifying portion 46 determines that the distance between the GND wire direct connected $N^+$ and $P^+$ diffusion regions has the danger of the latch-up occurrence.

In FIG. 20, for example, the whole GND wire direct connected $N^+$ diffusion region 184 lies within the oversize regions 188 and 189, so that it is determined that there is no danger of the latch-up occurrence in relation to the $N^+$ diffusion region 184. In FIG. 21, a part of the GND wire direct connected $N^+$ diffusion region 184 lies within the oversize regions 188 and 189, so that it is determined that there is no danger of the latch-up occurrence in relation to the $N^+$ diffusion region 184. In FIG. 22, the GND wire direct connected $N^+$ diffusion region 184 does not in the least lie within the oversize regions 188, 189, so that it is determined that there is the danger of the latch-up occurrence in relation to the $N^+$ diffusion region 184.

The determination result is outputted as the latch-up verification result data D39 to the verification result output portion 47.

In the step S47, the verification result output portion 47 outputs the verification result information (not shown) in the form of a list or graphical output on the basis of the latch-up verification result data D39.

The latch-up verification device of the fifth preferred embodiment, in the same fashion as the third preferred embodiment, verifies the distance between the $P^+$ and $N^+$ diffusion regions connected directly to the GND wire to thereby automatically verify the layout pattern in which there is the highly possible danger of the latch-up occurrence. The oversize regions established in the second to fifth preferred embodiments, which are square in shape, may be circular.

Sixth Preferred Embodiment

Figure 23:
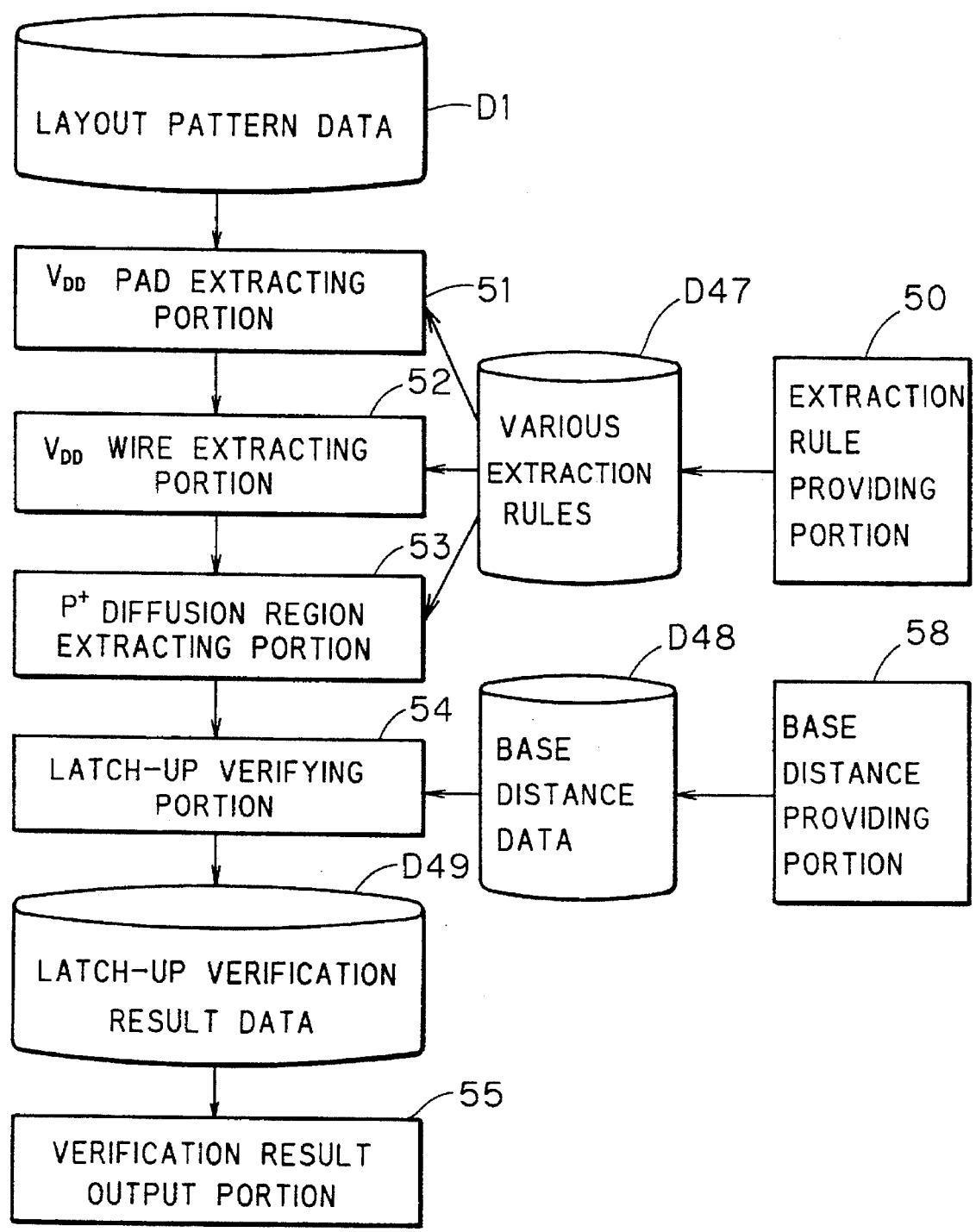
FIG. 23 is a block diagram of the latch-up verification device according to a sixth preferred embodiment of the present invention.
Figure 35:
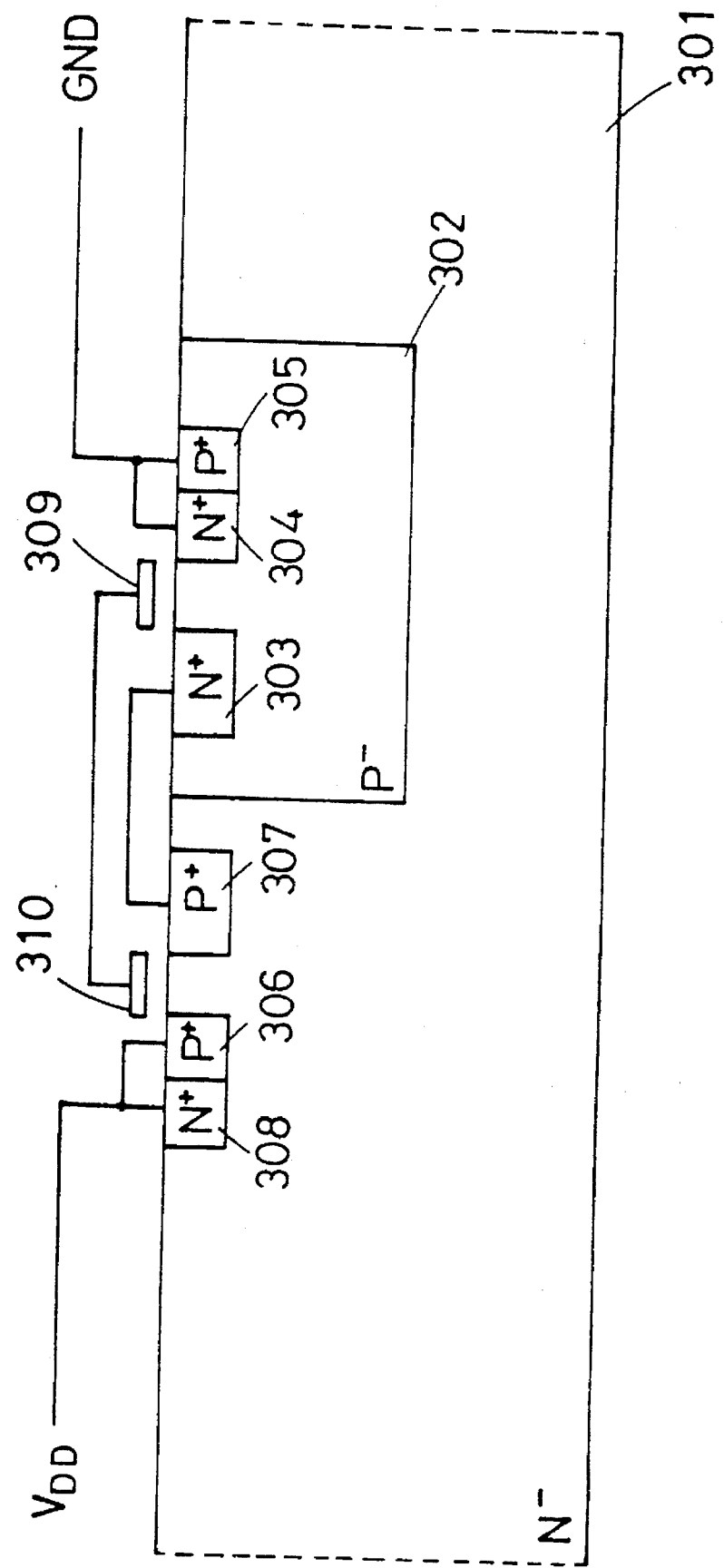
FIG. 35 is a cross-sectional view of an example of the CMOS structures.

FIG. 23 is a block diagram of the latch-up verification device according to a sixth preferred embodiment of the present invention. It should be noted that the latch-up verification device of the sixth preferred embodiment is intended to verify a CMOS integrated circuit including an $N^-$ substrate 301 and a $P^-$ well region 302 formed in the upper portion of the $N^-$ substrate 301 as shown in FIG. 35.

Referring to FIG. 23, various extraction rules D47 including $V_{DD}$ pad information, $V_{DD}$ wire information and $P^+$ diffusion region information are outputted from an extraction rule providing portion 50 to a $V_{DD}$ pad extracting portion 51, a $V_{DD}$ wire extracting portion 52 and a $P^+$ diffusion region extracting portion 53.

The $V_{DD}$ pad extracting portion 51 receives the layout pattern data D1 from the layout pattern data providing means (not shown) and extracts a $V_{DD}$ pad from the layout pattern data D1 by using the $V_{DD}$ pad information of the various extraction rules D47 to output the $V_{DD}$ pad extracted layout pattern data D1 to the $V_{DD}$ wire extracting portion 52.

The $V_{DD}$ wire extracting portion 52 extracts a $V_{DD}$ wire extending from the $V_{DD}$ pad from the $V_{DD}$ pad extracted layout pattern data D1 by using the $V_{DD}$ wire information of the various extraction rules D47 to output the $V_{DD}$ wire extracted layout pattern data D1 to the $P^+$ diffusion region extracting portion 53.

The $P^+$ diffusion region extracting portion 53 extracts a $P^+$ diffusion region which is formed in the upper portion of the $N^-$ substrate and is connected directly to the $V_{DD}$ wire from the $V_{DD}$ wire extracted layout pattern data D1 by using the $P^+$ diffusion region information of the various extraction rules D47, to output the $V_{DD}$ wire direct connected $P^+$ diffusion region extracted layout pattern data D1 to a latch-up verifying portion 54.

A base distance providing portion 58 outputs base distance data D48 serving as verifying data to the latch-up verifying portion 54. It should be noted that the base distance data D48 is determined as a function of the impurity concentrations of the $N^-$ substrate and the $P^-$ well region.

The latch-up verifying portion 54 measures a base distance between the $V_{DD}$ wire direct connected $P^+$ diffusion region and the $P^-$ well region from the $V_{DD}$ wire direct connected $P^+$ diffusion region extracted layout pattern data D1 to verify whether or not the base distance is more than a distance specified by the base distance data D48. If the base distance is not less than the distance specified by the base distance data D48, the latch-up verifying portion 54 determines that there is no danger of latch-up. If the base distance is not more than the distance specified by the base distance data D48, the latch-up verifying portion 54 determines that the PNP bipolar transistor consisting of the $V_{DD}$ wire direct connected $P^+$ diffusion region, the $N^-$ substrate and the $P^-$ well region becomes active easily so that there is the danger of the latch-up occurrence. Then the latch-up verifying portion 54 outputs to a verification result output portion 55 latch-up verification result data D49 containing a pair of $P^-$ well region and $V_{DD}$ wire direct connected $P^+$ diffusion region which has been determined to have the danger of the latch-up occurrence.

The details of the aforesaid verification will be described hereinafter using the CMOS structure of FIG. 35 as an example. In FIG. 35, a $P^+$ diffusion region 306 connected directly to the power supply $V_{DD}$, the $N^-$ substrate 301 and the $P^-$ well region 302 form a parasitic PNP bipolar transistor which causes latch-up. The $P^+$ diffusion region 306 is spaced a sufficient distance from the $P^-$ well region 302 as shown in FIG. 35, the parasitic PNP bipolar transistor has a large base width. Thus the current amplification factor of the parasitic PNP bipolar transistor is limited, so that the parasitic PNP bipolar transistor does not become active easily.

On the other hand, if the $P^+$ diffusion region 306 is spaced a relatively short distance from the $P^-$ well region 302, the parasitic PNP bipolar transistor has a small base width. Thus the current amplification factor of the parasitic PNP bipolar transistor increases, so that the danger of the latch-up occurrence is considered to be highly possible.

The verification result output portion 55 outputs verification result information (not shown) in the form of a list or graphical output on the basis of the latch-up verification result data D49.

Figure 24:
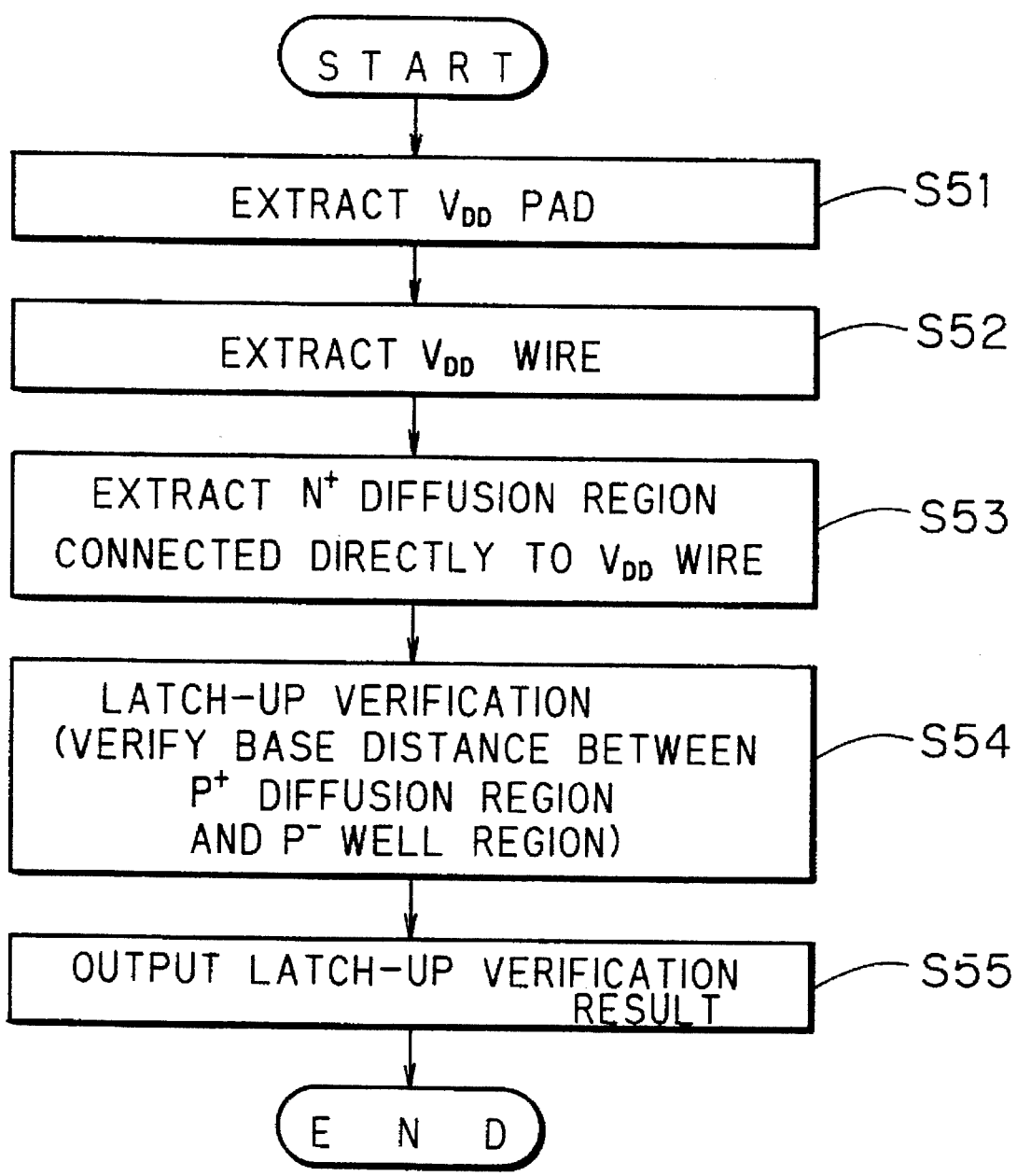
FIG. 24 is a flow chart showing the operation of the latch-up verification device of the sixth preferred embodiment.
Figure 25:
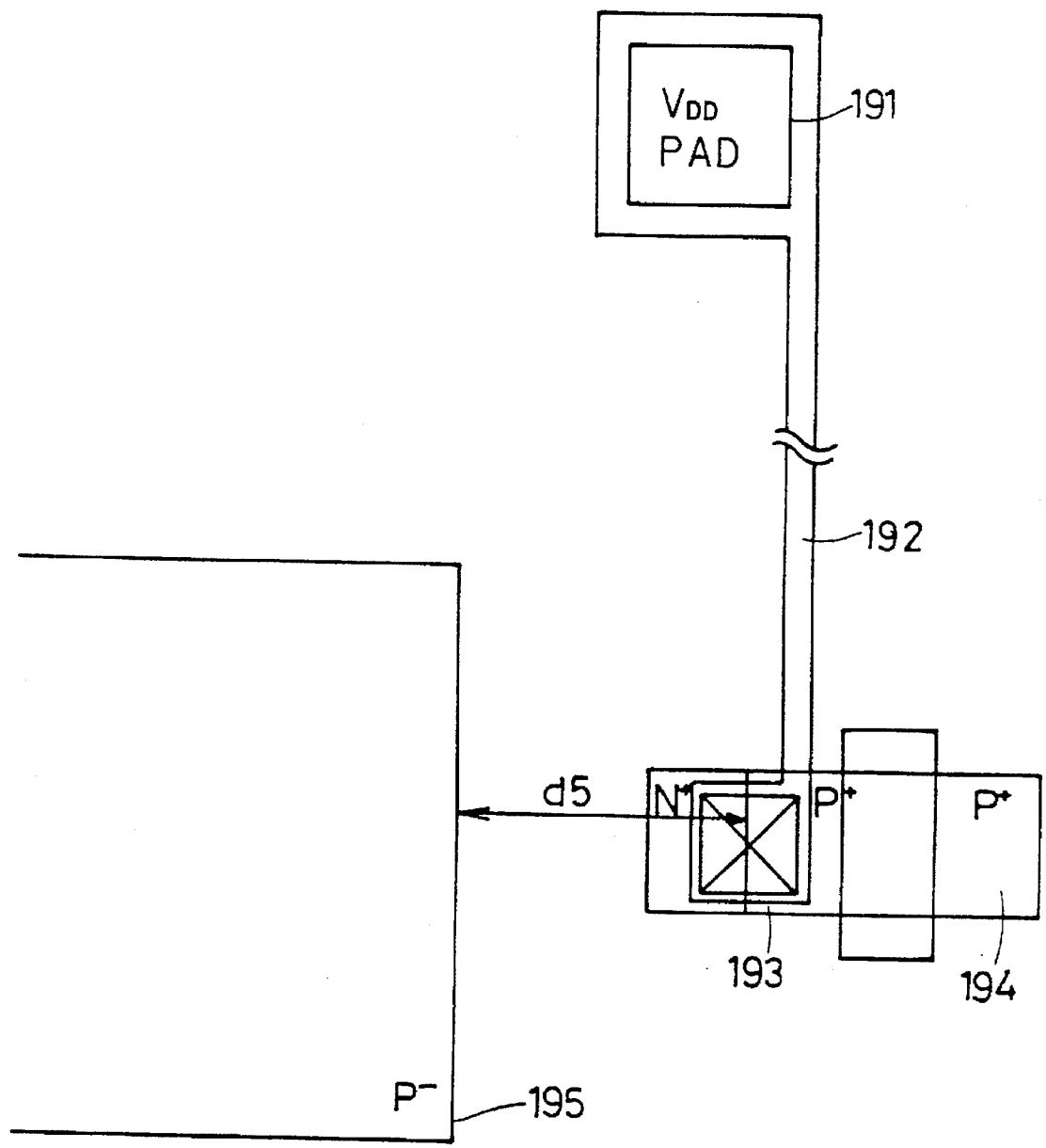
FIG. 25 is a plan view of a layout pattern for delineating the operation of the latch-up verification device of the sixth preferred embodiment.

FIG. 24 is a flow chart of the operation of the latch-up verification device of the sixth preferred embodiment. FIG. 25 is a plan view for delineating the operation of the latch-up verification device. Referring to FIGS. 24 and 25, the verification operation will be discussed hereinafter.

In the step S51, the $V_{DD}$ pad extracting portion 51 extracts a $V_{DD}$ pad 191 from the layout pattern data D1 by using the $V_{DD}$ pad information of the various extraction rules D47 to output the $V_{DD}$ pad extracted layout pattern data D1 to the $V_{DD}$ wire extracting portion 52.

In the step S52, the $V_{DD}$ wire extracting portion 52 extracts a $V_{DD}$ wire 192 extending from the $V_{DD}$ pad 191 from the $V_{DD}$ pad extracted layout pattern data D1 by using the $V_{DD}$ wire information of the various extraction rules D47 to output the $V_{DD}$ wire extracted layout pattern data D1 to the $P^+$ diffusion region extracting portion 53.

In the step D53, the $P^+$ diffusion region extracting portion 53 extracts a $P^+$ diffusion region 193 connected directly to the $V_{DD}$ wire 192 among $P^+$ diffusion regions 193 and 194 formed in the upper portion of the $N^-$ substrate (not shown) from the $V_{DD}$ wire extracted layout pattern data D1 by using the $P^+$ diffusion region information of the various extraction rules D47, to output the $V_{DD}$ wire direct connected $P^+$ diffusion region extracted layout pattern data D1 to the latch-up verifying portion 54.

In the step S54, the base distance providing portion 58 outputs the base distance data D48 serving as verifying data to the latch-up verifying portion 54. The latch-up verifying portion 54 measures a base distance d5 between the $V_{DD}$ wire direct connected $P^+$ diffusion region 193 and a $P^-$ well region 195 from the $V_{DD}$ wire direct connected $P^+$ diffusion region extracted layout pattern data D1, to verify whether or not the base distance d5 is more than the distance specified by the base distance data D48. If the base distance d5 is not less than the specified distance, the latch-up verifying portion 54 determines that there is no danger of latch-up. If the base distance d5 is not more than the specified distance, the latch-up verifying portion 54 determines that there is the danger of the latch-up occurrence. The latch-up verifying portion 54 then outputs the verification result as the latch-up verification result data D49 to the verification result output portion 55.

In the step S55, the verification result output portion 55 outputs the verification result information (not shown) in the form of a list or graphical output on the basis of the latch-up verification result data D49.

The latch-up verification device of the sixth preferred embodiment, as described hereinabove, verifies the distance between the $P^+$ diffusion region connected directly to the $V_{DD}$ wire and the $P^-$ well region to thereby automatically verify the layout pattern in which there is the highly possible danger of the latch-up occurrence.

Seventh Preferred Embodiment

Figure 26:
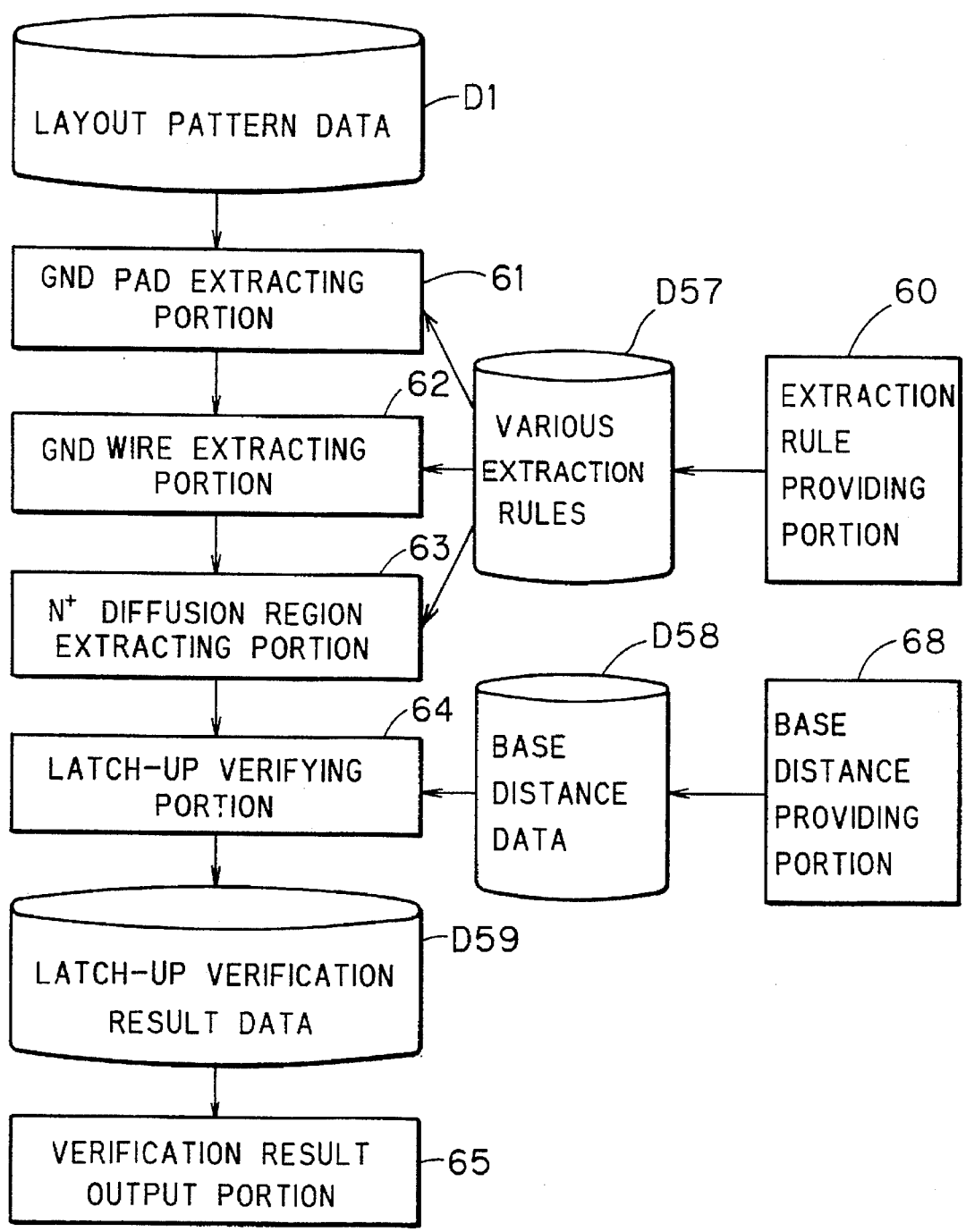
FIG. 26 is a block diagram of the latch-up verification device according to a seventh preferred embodiment of the present invention.

FIG. 26 is a block diagram of the latch-up verification device according to a seventh preferred embodiment of the present invention. It should be noted that the latch-up verification device of the seventh preferred embodiment is intended to verify a CMOS integrated circuit including the $P^-$ substrate 101 and the $N^-$ well region 102 formed in the upper portion of the $P^-$ substrate 101 as shown in FIG. 29.

Referring to FIG. 26, various extraction rules D57 including GND pad information, GND wire information and $N^+$ diffusion region information are outputted from an extraction rule providing portion 60 to a GND pad extracting portion 61, a GND wire extracting portion 62 and an $N^+$ diffusion region extracting portion 63.

The GND pad extracting portion 61 receives the layout pattern data D1 from the layout pattern data providing means (not shown) and extracts a GND pad from the layout pattern data D1 by using the GND pad information of the various extraction rules D57 to output the GND pad extracted layout pattern data D1 to the GND wire extracting portion 62.

The GND wire extracting portion 62 extracts a GND wire extending from the GND pad from the GND pad extracted layout pattern data D1 by using the GND wire information of the various extraction rules D57 to output the GND wire extracted layout pattern data D1 to the $N^+$ diffusion region extracting portion 63.

The $N^+$ diffusion region extracting portion 63 extracts an $N^+$ diffusion region which is formed in the upper portion of the $P^-$ substrate and is connected directly to the GND wire from the GND wire extracted layout pattern data D1 by using the $N^+$ diffusion region information of the various extraction rules D57, to output the GND wire direct connected $N^+$ diffusion region extracted layout pattern data D1 to a latch-up verifying portion 64.

A base distance providing portion 68 outputs base distance data D58 serving as verifying data to the latch-up verifying portion 64. It should be noted that the base distance data D58 is determined as a function of the impurity concentrations of the $P^-$ substrate and the $N^-$ well region.

The latch-up verifying portion 64 measures a base distance between the GND wire direct connected $N^+$ diffusion region and the $N^-$ well region from the GND wire direct connected $N^+$ diffusion region extracted layout pattern data D1 to verify whether or not the base distance is more than a distance specified by the base distance data D58. If the base distance is not less than the distance specified by the base distance data D58, the latch-up verifying portion 64 determines that there is no danger of latch-up. If the base distance is not more than the distance specified by the base distance data D58, the latch-up verifying portion 64 determines that the NPN bipolar transistor consisting of the GND wire direct connected $N^+$ diffusion region, the $P^-$ substrate and the $N^-$ well region becomes active easily so that there is the danger of the latch-up occurrence. Then the latch-up verifying portion 64 outputs to a verification result output portion 65 latch-up verification result data D59 containing a pair of $N^-$ well region and GND wire direct connected $N^+$ diffusion region which has been determined to have the danger of the latch-up occurrence.

The details of the aforesaid verification will be described hereinafter using the CMOS structure of FIG. 29 as an example. In FIG. 29, the $N^+$ diffusion region 106 connected directly to the GND level, the $P^-$ substrate 101 and the $N^-$ well region 102 form a parasitic NPN bipolar transistor (corresponding to T2 of FIG. 30) which causes latch-up. The $N^+$ diffusion region 106 is spaced a sufficient distance from the $N^-$ well region 102 as shown in FIG. 29, the current amplification factor of the parasitic NPN bipolar transistor is very low, similarly to the sixth preferred embodiment.

On the other hand, if the $N^+$ diffusion region 106 is spaced a relatively short distance from the $N^-$ well region 102, the parasitic NPN bipolar transistor has a small base width. Thus the current amplification factor of the parasitic NPN bipolar transistor increases, so that the danger of the latch-up occurrence is considered to be highly possible.

The verification result output portion 65 outputs verification result information (not shown) in the form of a list or graphical output on the basis of the latch-up verification result data D59.

Figure 27:
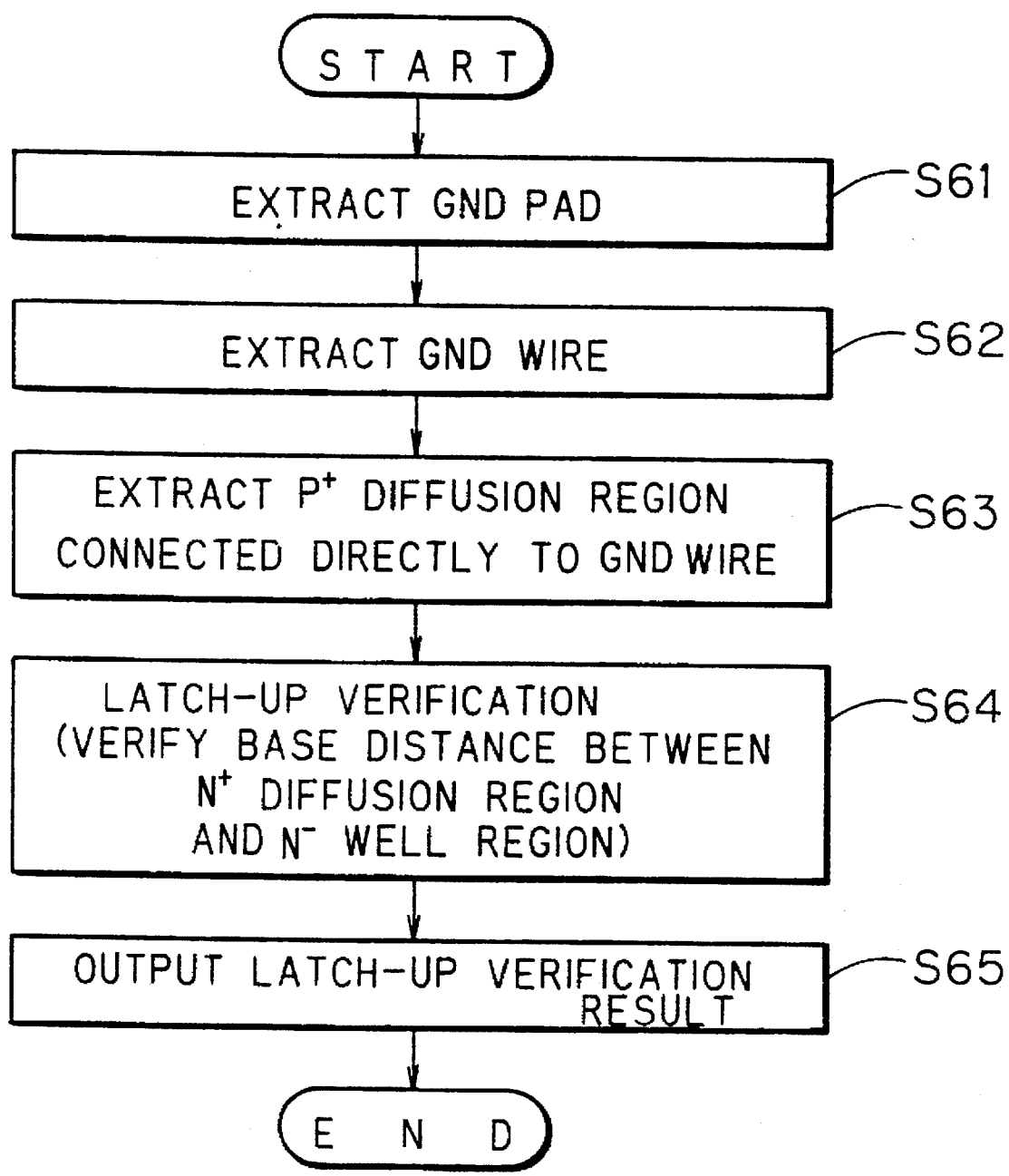
FIG. 27 is a flow chart showing the operation of the latch-up verification device of the seventh preferred embodiment.
Figure 28:
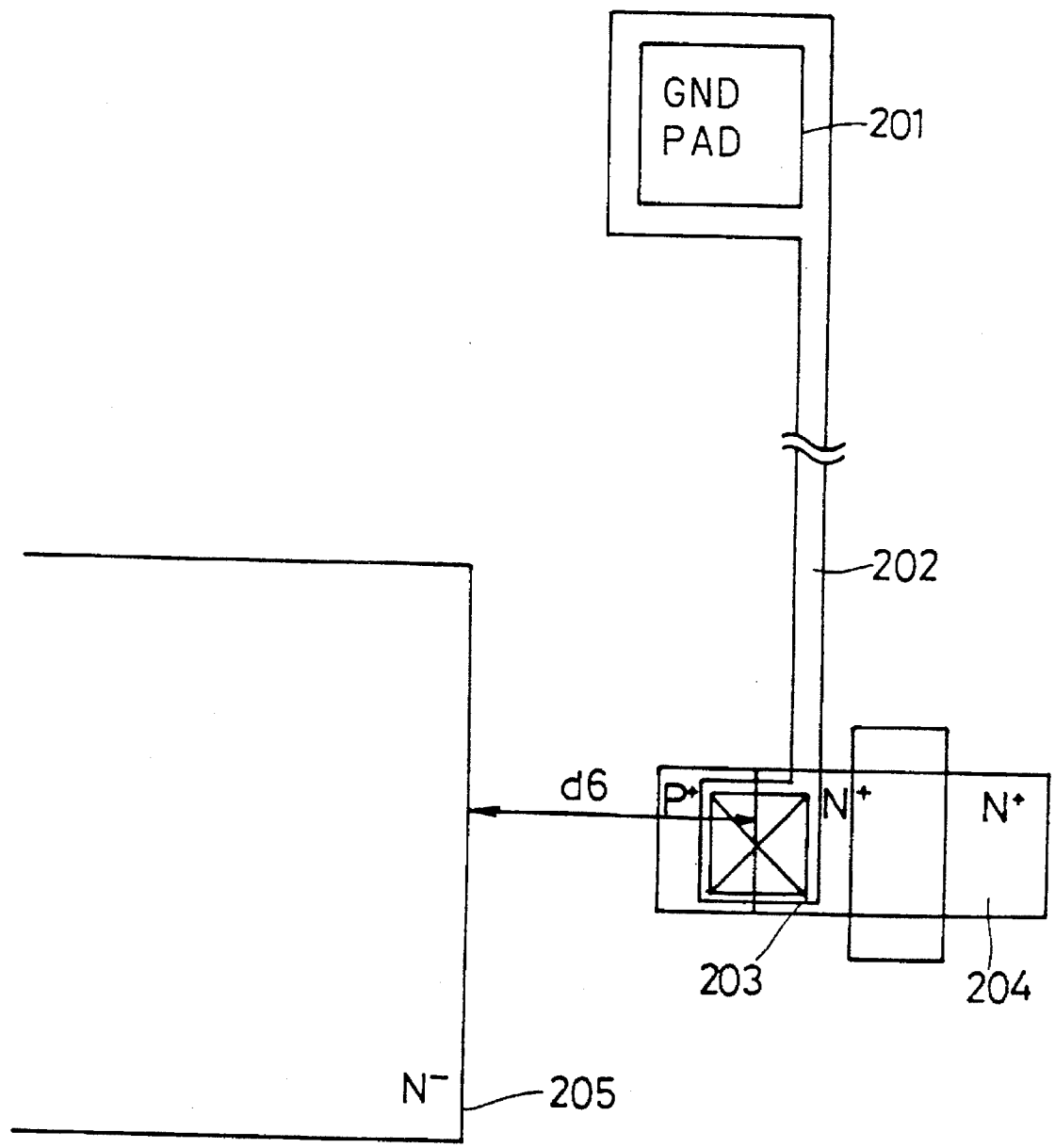
FIG. 28 is a plan view of a layout pattern for delineating the operation of the latch-up verification device of the seventh preferred embodiment.

FIG. 27 is a flow chart of the operation of the latch-up verification device of the seventh preferred embodiment. FIG. 28 is a plan view for delineating the operation of the latch-up verification device. Referring to FIGS. 27 and 28, the verification operation will be discussed hereinafter.

In the step S61, the GND pad extracting portion 61 extracts a GND pad 201 from the layout pattern data D1 by using the GND pad information of the various extraction rules D57 to output the GND pad extracted layout pattern data D1 to the GND wire extracting portion 62.

In the step S62, the GND wire extracting portion 62 extracts a GND wire 202 extending from the GND pad 201 from the GND pad extracted layout pattern data D1 by using the GND wire information of the various extraction rules D57 to output the GND wire extracted layout pattern data D1 to the $N^+$ diffusion region extracting portion 63.

In the step D63, the $N^+$ diffusion region extracting portion 63 extracts an $N^+$ diffusion region 203 connected directly to the GND wire 202 among $N^+$ diffusion regions 203 and 204 formed in the upper portion of the $P^-$ substrate (not shown) from the GND wire extracted layout pattern data D1 by using the $N^+$ diffusion region information of the various extraction rules D57, to output the GND wire direct connected $N^+$ diffusion region extracted layout pattern data D1 to the latch-up verifying portion 64.

In the step S64, the base distance providing portion 68 outputs the base distance data D58 serving as verifying data to the latch-up verifying portion 64. The latch-up verifying portion 64 measures a base distance d6 between the GND wire direct connected $N^+$ diffusion region 203 and an $N^-$ well region 205 from the GND wire direct connected $N^+$ diffusion region extracted layout pattern data D1, to verify whether or not the base distance d6 is more than the distance specified by the base distance data D58. If the base distance d6 is not less than the specified distance, the latch-up verifying portion 64 determines that there is no danger of latch-up. If the base distance d6 is not more than the specified distance, the latch-up verifying portion 64 determines that there is the danger of the latch-up occurrence. The latch-up verifying portion 64 then outputs the verification result as the latch-up verification result data D59 to the verification result output portion 65.

In the step S65, the verification result output portion 65 outputs the verification result information (not shown) in the form of a list or graphical output on the basis of the latch-up verification result data D59.

The latch-up verification device of the seventh preferred embodiment, as described hereinabove, verifies the distance between the $N^+$ diffusion region connected directly to the GND wire and the $N^-$ well region to thereby automatically verify the layout pattern in which there is the highly possible danger of the latch-up occurrence.

Although the latch-up verification device of the first to seventh preferred embodiment alone has sufficient effects, a latch-up verification device formed by the combination of some of the preferred embodiments provides higher verification accuracy.

While the invention has been shown and described in detail, the foregoing description is in all aspects illustrative and not restrictive. It is therefore understood that numerous modifications and variations can be devised without departing from the scope of the invention.

What is claimed is:

1. A latch-up verification device comprising:
   layout pattern data providing means for providing layout pattern data specifying a layout pattern of a CMOS semiconductor integrated circuit including a semiconductor substrate of a first conductivity type and at least one well region of a second conductivity type formed on said semiconductor substrate;
   in-well MOS transistor extracting means for extracting at least one MOS transistor formed in said well region as an in-well MOS transistor as a function of said layout pattern data;
   grouping means for grouping together said in-well MOS transistors in units of one well region having a same back gate terminal and adding same back gate terminal information to the grouped together in-well MOS transistors; and
   latch-up verifying means for verifying the danger of latch-up occurrence in said layout pattern specified by said layout pattern data as a function of connection between a first electrode of said in-well MOS transistor and said well region in which said in-well MOS transistor is formed and of said same back gate terminal information.

2. The latch-up verification device of claim 1, further comprising:
   error message output means for outputting an error message in list form as a function of the verification result of said latch-up verifying means.

3. The latch-up verification device of claim 2, further comprising:
   transistor recognition rule data providing means for providing transistor recognition rule data recognizing an MOS transistor from said layout pattern data,
   wherein said in-well MOS transistor extracting means refers to said transistor recognition rule data to extract said in-well MOS transistor as a function of said layout pattern data.

4. A latch-up verification device comprising:
   layout pattern data providing means for providing layout pattern data specifying a layout pattern of a CMOS semiconductor integrated circuit including a semiconductor substrate of a first conductivity type and at least one well region of a second conductivity type formed on said semiconductor substrate;
   in-well MOS transistor extracting means for extracting at least one MOS transistor formed in said well region as an in-well MOS transistor as a function of said layout pattern data; and
   latch-up verifying means for verifying the danger of latch-up occurrence in said layout pattern specified by said layout pattern data as a function of the following conditions:
   (a) said first electrode of said in-well MOS transistor is connected directly to said well region;
   (b) said first electrode of said in-well MOS transistor is connected to said well region through a resistance;
   (c) said first electrode of said in-well MOS transistor is connected to said well region through a single or a plurality of transistors included in the same well region in series in a direction from said first electrode to a second electrode of said in-well MOS transistor,
   to determine that there is no danger of latch-up occurrence in said layout pattern when any of the conditions (a) to (c) is satisfied and to determine that there is the danger of latch-up occurrence when none of the conditions (a) to (c) is satisfied.

5. A latch-up verification device comprising:
   layout pattern data providing means for providing layout pattern data specifying a layout pattern of a CMOS semiconductor integrated circuit including a semiconductor substrate of a first conductivity type and at least one well region of a second conductivity type formed on said semiconductor substrate;

semiconductor region extracting means receiving said layout pattern data for extracting from said layout pattern data a first semiconductor region of said first conductivity type and a second semiconductor region of said second conductivity type each formed in a surface of said semiconductor substrate or said common well region and connected directly to a common power supply; and latch-up verifying means for verifying the danger of latch-up occurrence in said layout pattern specified by said layout pattern data as a function of a distance between said first and second semiconductor regions.

6. A latch-up verification comprising:

layout pattern data providing means for providing layout pattern data specifying a layout pattern of a CMOS semiconductor integrated circuit including a semiconductor substrate of a first conductivity type and at least one well region of a second conductivity type formed on said semiconductor substrate;

semiconductor region extracting means receiving said layout pattern data for extracting from said layout pattern data a first semiconductor region of said first conductivity type and a second semiconductor region of said second conductivity type, each formed in a surface of said semiconductor substrate or said common well region and connected directly to a common power supply;

latch-up verifying means for verifying the danger of latch-up occurrence in said layout pattern specified by said layout pattern data as a function of a distance between said first and second semiconductor regions;

extraction rule providing means for providing extraction rules containing information specifying from said layout pattern a power supply pad, a power supply wire, a semiconductor region of said first conductivity type and a semiconductor region of said second conductivity type which exist in said layout pattern, wherein said semiconductor region extracting means includes:

power supply pad extracting means for extracting a power supply pad of said common power supply from said layout pattern data with reference to said extraction rules to output power supply pad extracted layout pattern data;

power supply wire extracting means for extracting a power supply wire extending from said power supply pad from said power supply pad extracted layout pattern data with reference to said extraction rules to output power supply wire extracted layout pattern data;

first power supply connected semiconductor region extracting means for extracting said first semiconductor region of said first conductivity type formed in a surface of said semiconductor substrate or said common well region and connected directly to said power supply wire from said power supply wire extracted layout pattern data with reference to said extraction rules to output first semiconductor region extracted layout pattern data; and second power supply connected semiconductor region extracting means for extracting said second semiconductor region of said second conductivity type formed in a surface of said semiconductor substrate or said common well region and connected directly to said power supply wire from said first semiconductor region extracted layout pattern data with reference to said extraction rules to output first and second semiconductor region extracted layout pattern data, and wherein said latch-up verifying means verifies the danger of latch-up occurrence in said layout pattern specified by said layout pattern data as a function of a distance between said first semiconductor region and said second semiconductor region given from said first and second semiconductor region extracted layout pattern data.

7. The latch-up verification device of claim 6, further comprising:

oversize information providing means for providing predetermined oversize establishing data, wherein said latch-up verifying means includes:

oversize region establishing means for establishing a square oversize region of a size specified by said oversize establishing data about said first semiconductor region from said first and second semiconductor region extracted layout pattern data to output oversize region established layout pattern data; and oversize verifying means for verifying the danger of latch-up occurrence in said layout pattern specified by said layout pattern data as a function of the presence of said second semiconductor region in said oversize region from said oversize region established layout pattern data.

8. The latch-up verification device of claim 7, further comprising:

error message output means for outputting an error message in list form as a function of the verification result of said latch-up verifying means.

9. The latch-up verification device of claim 8, wherein said CMOS semiconductor integrated circuit has a first driving power supply and a second driving power supply lower in potential than said first power supply, said common power supply is said first power supply, said first conductivity type is P type, and said second conductivity type is N type.

10. The latch-up verification device of claim 8, wherein said CMOS semiconductor integrated circuit has a first driving power supply and a second driving power supply lower in potential than said first power supply, said common power supply is said second power supply, said first conductivity type is N type, and said second conductivity type is P type.

11. The latch-up verification device of claim 6, further comprising:

oversize information providing means for providing predetermined oversize establishing data, wherein said latch-up verifying means includes:

oversize region establishing means for establishing a square oversize region of a size specified by said oversize establishing data about said first semiconductor region from said first and second semiconductor region extracted layout pattern data to output oversize region established layout pattern data; and oversize verifying means for verifying the danger of latch-up occurrence in said layout pattern specified by said layout pattern data as a function of a detection result of the absence of said second semiconductor region in said oversize region from said oversize region established layout pattern data.

12. The latch-up verification device of claim 11, further comprising:

error message output means for outputting an error message in list form as a function of the verification result of said latch-up verifying means.

13. The latch-up verification device of claim 12, wherein said CMOS semiconductor integrated circuit has a first driving power supply and a second driving power supply lower in potential than said first power supply, said common power supply is said first power supply, said first conductivity type is N type, and said second conductivity type is P type.

14. The latch-up verification device of claim 12, wherein said CMOS semiconductor integrated circuit has a first driving power supply and a second driving power supply lower in potential than said first power supply, said common power supply is said second power supply, said first conductivity type is P type, and said second conductivity type is N type.

15. A latch-up verification device comprising:

layout pattern data providing means for providing layout pattern data specifying a layout pattern of a CMOS semiconductor integrated circuit including a semiconductor substrate of a first conductivity type and at least one well region of a second conductivity type formed on said semiconductor substrate;

semiconductor region extracting means receiving said layout pattern data for extracting from said layout pattern data a semiconductor region of said second conductivity type formed in a surface of said semiconductor substrate and connected directly to a predetermined power supply; and latch-up verifying means for verifying the danger of latch-up occurrence in said layout pattern specified by said layout pattern data as a function of a distance between said semiconductor region and said well region.

16. A latch-up verification comprising:

layout pattern data providing means for providing layout pattern data specifying a layout pattern of a CMOS semiconductor integrated circuit including a semiconductor substrate of a first conductivity type and at least one well region of a second conductivity type formed on said semiconductor substrate;

semiconductor region extracting means receiving said layout pattern data for extracting from said layout pattern data a semiconductor region of said second conductivity type formed in a surface of said semiconductor substrate and connected directly to a predetermined power supply;

latch-up verifying means for verifying the danger of latch-up occurrence in said layout pattern specified by said layout pattern data as a function of a distance between said semiconductor region and said well region;

extraction rule providing means for providing extraction rules containing information specifying from said layout pattern a power supply pad, a power supply wire and a semiconductor region of said second conductivity type which exist in said layout pattern, wherein said semiconductor region extracting means includes:

power supply pad extracting means for extracting a power supply pad of said predetermined power supply from said layout pattern data with reference to said extraction rules to output power supply pad extracted layout pattern data;

power supply wire extracting means for extracting a power supply wire extending from said power supply pad from said power supply pad extracted layout pattern data with reference to said extraction rules to output power supply wire extracted layout pattern data; and power supply connected semiconductor region extracting means for extracting said semiconductor region of said second conductivity type formed in a surface of said semiconductor substrate and connected directly to said power supply wire from said power supply wire extracted layout pattern data with reference to said extraction rules to output semiconductor region extracted layout pattern data, and wherein said latch-up verifying means verifies the danger of latch-up occurrence in said layout pattern specified by said layout pattern data as a function of a distance between said semiconductor region given from said semiconductor region extracted layout pattern data and said well region.

17. The latch-up verification device of claim 16, further comprising:

base distance information providing means for providing predetermined base distance data, wherein said latch-up verifying means verifies the danger of latch-up occurrence in said layout pattern specified by said layout pattern data as a function of a comparison result between said distance and said base distance data.

18. The latch-up verification device of claim 17, further comprising:

error message output means for outputting an error message in list form as a function of the verification result of said latch-up verifying means.

19. The latch-up verification device of claim 18, wherein said CMOS semiconductor integrated circuit has a first driving power supply and a second driving power supply lower in potential than said first power supply, said predetermined power supply is said first power supply, said first conductivity type is N type, and said second conductivity type is P type.

20. The latch-up verification device of claim 18, wherein said CMOS semiconductor integrated circuit has a first driving power supply and a second driving power supply lower in potential than said first power supply, said predetermined power supply is said second power supply, said first conductivity type is P type, and said second conductivity type is N type.

* * * * *